US007480028B2

(12) United States Patent (10) Patent No.: US 7,480,028 B2
Van Der Veen et al. (45) Date of Patent: Jan. 20, 2009

(54) LITHOGRAPHIC APPARATUS FOR IMAGING A FRONT SIDE OR A BACK SIDE OF A SUBSTRATE, METHOD OF SUBSTRATE IDENTIFICATION, DEVICE MANUFACTURING METHOD, SUBSTRATE, AND COMPUTER PROGRAM

(75) Inventors: Michael Van Der Veen, Eindhoven (NL); Anastasius Jacobus Anicetus Bruinsma, Delft (NL); Henricus Wilhelmus Maria Van Buel, Eindhoven (NL); Jacob Fredrik Friso Klinkhamer, Delft (NL); Martinus Hendrikus Antonius Leenders, Rotterdam (NL); Christianus Gerardus Maria De Mol, Son en Breugel (NL); Hubert Adriaan Van Mierlo, Maassluis (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/069,058

(22) Filed: Mar. 2, 2005

(65) Prior Publication Data
US 2005/0248740 A1 Nov. 10, 2005

Related U.S. Application Data

(63) Continuation-in-part of application No. 10/790,252, filed on Mar. 2, 2004, now abandoned, which is a continuation-in-part of application No. 10/954,654, filed on Oct. 1, 2004, now Pat. No. 7,177,009.

(51) Int. Cl.
*G03B 27/42* (2006.01)
*G03B 27/52* (2006.01)

(52) U.S. Cl. ........................................... 355/53; 355/55

(58) Field of Classification Search .......... 356/399–401; 355/53, 55, 67, 52, 77; 430/311; 250/548
See application file for complete search history.

(56) References Cited

U.S. PATENT DOCUMENTS 6,949,755 B2 * 9/2005 Tanaka ................... 250/491.1

(Continued)

FOREIGN PATENT DOCUMENTS

JP 05-217843 A 8/1993

(Continued)

OTHER PUBLICATIONS

"Martix coding for optical identification of die", Research Disclosure Database No. 467095 (Mar. 2003).

(Continued)

*Primary Examiner*—Hung Henry V Nguyen
(74) *Attorney, Agent, or Firm*—Pillsbury Winthrop Shaw Pittman LLP

(57) ABSTRACT

The invention is directed to enabling substrate identification by comparing the measured distance between two features on an unidentified substrate with one or more stored distances. The one or more stored distances are the distances intended during the design of one or more substrates. The unidentified substrate is identified by a stored distance that corresponds to the measured distance. The two features are selected from a plurality of features that may be placed on a back side or a front side of a substrate. An optical system is provided for reading the features from the back side or a front side of the substrate.

26 Claims, 10 Drawing Sheets

U.S. PATENT DOCUMENTS

| | | | |
|---|---|---|---|
| 7,138,283 B2 * | 11/2006 | Matsushita et al. | 438/14 |
| 7,259,828 B2 * | 8/2007 | Tolsma et al. | 355/40 |
| 2002/0109825 A1 * | 8/2002 | Gui et al. | 355/53 |
| 2003/0211297 A1 * | 11/2003 | Rossing et al. | 428/195.1 |
| 2004/0070740 A1 * | 4/2004 | Irie | 355/52 |
| 2004/0156027 A1 * | 8/2004 | Best et al. | 355/53 |
| 2006/0072087 A1 * | 4/2006 | Klinkhamer et al. | 355/53 |

FOREIGN PATENT DOCUMENTS

| | | |
|---|---|---|
| JP | 05-259010 A | 10/1993 |
| JP | 9-275066 A | 10/1997 |
| JP | 2002-280299 A | 9/2002 |

OTHER PUBLICATIONS

Notice of Reasons for Rejection for Japanese Patent Application No. 2005-099664 dated Jun. 5, 2008.

* cited by examiner

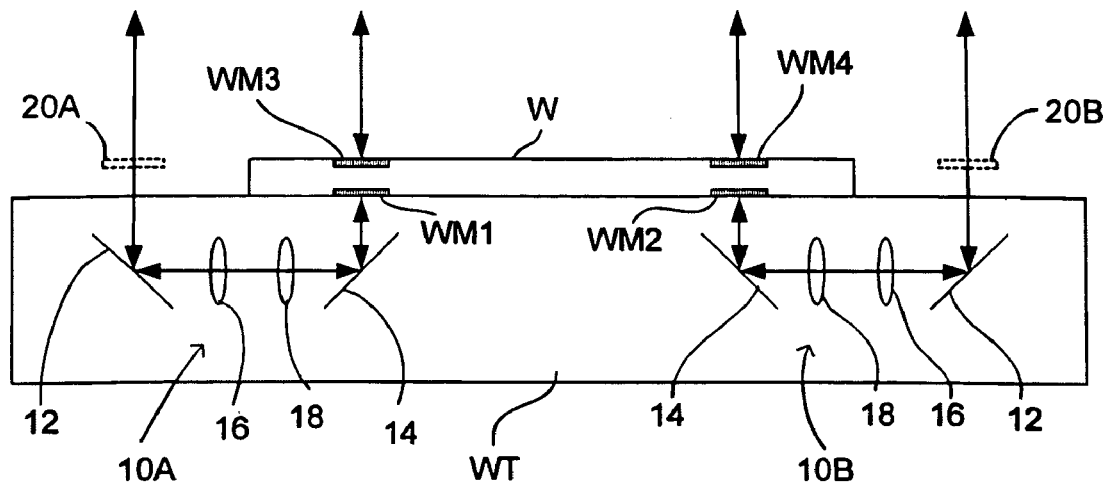
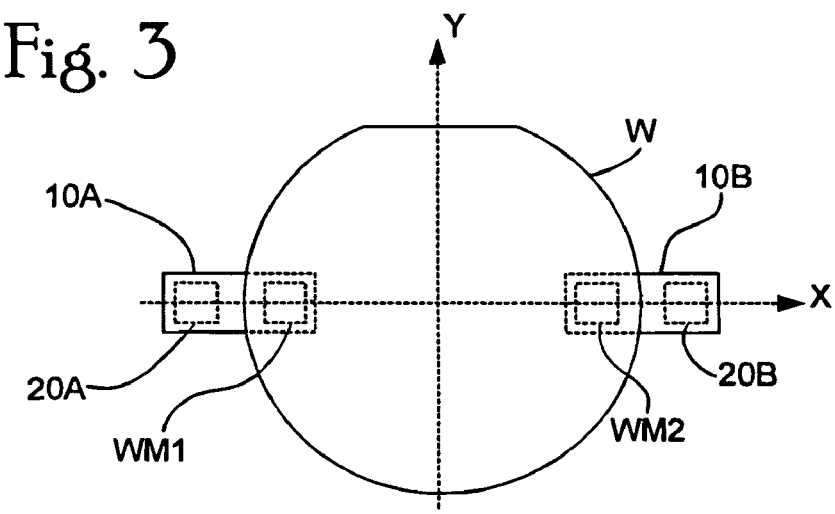
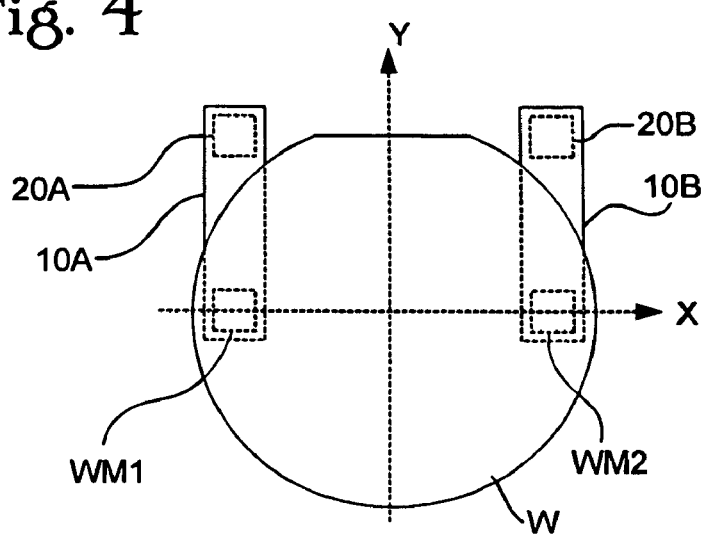

LITHOGRAPHIC APPARATUS FOR IMAGING A FRONT SIDE OR A BACK SIDE OF A SUBSTRATE, METHOD OF SUBSTRATE IDENTIFICATION, DEVICE MANUFACTURING METHOD, SUBSTRATE, AND COMPUTER PROGRAM

This application claims priority from and is a continuation-in-part of U.S. patent application Ser. No. 10/790,252 filed on Mar. 2, 2004 which is now abandoned and also claims priority from and is a continuation-in-part of U.S. patent application Ser. No. 10/954,654 filed on Oct. 1, 2004, which is now U.S. Pat. No. 7,177,009 both of which are herein incorporated by reference in their entirety.

BACKGROUND OF THE INVENTION

1. Field of the Invention

The invention relates to substrate measurement that is performed on a front side or a back side of a substrate.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning structure, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

During production of integrated circuits, a substrate is typically fed into a lithographic apparatus several times in order to be able to produce a circuit which consists of several layers on top of each other. As many as 30 layers can be used. The lithographic apparatus used to generate the circuit pattern in the first layer is typically not the same as the lithographic apparatus used to generate the circuit pattern in the final layer. This is because the features of the circuit pattern in the final layer are typically much larger than the features in the first layer, so that a less accurate and therefore less expensive lithographic apparatus can be used to apply the desired circuit pattern to the final layer.

Conventionally substrates are provided with alignment marks whose positions relative to the target portions are known. During alignment, an alignment sensor measures the positions of the alignment marks. In this way, the positions of the target portions may be determined. The alignment sensor views a small area on the substrate at a given time, the small area being considered the footprint of the alignment sensor. Often, when alignment is begun, the alignment mark does not coincide with the area viewed by the alignment sensor. To solve this problem, the substrate is scanned underneath the alignment sensor, over a distance sufficiently large to make certain that the alignment mark passes through the area viewed by the alignment sensor. The position of the alignment mark is measured as it passes through the area viewed by the alignment sensor.

A possible disadvantage of this alignment method is that scanning of the substrate is time consuming, and thus effects the number of substrates that can be processed by the lithographic apparatus per hour.

Instead of using alignment marks, U.S. Pat. No. 3,898,617 describes an alignment system that measures positions of circuit features so that alignment is performed using circuit features. The alignment sensor views a small area of a target portion on the substrate. The sensor records an image of the circuit features located in the area of the target portion. The image is compared to a library which includes images of circuit features and their associated locations. When a match is found between the measured image and a library image, the associated location retrieved from the library gives the location of the substrate.

A possible disadvantage of this method is that a time consuming scan of the substrate underneath the alignment sensor may be needed until a recorded image is found which matches an image in the library.

Once alignment is achieved, several lithographic apparatuses may be involved to simultaneously apply the desired circuit pattern onto the first layer or any other layer of the substrate. Even though the calibrations of the machines are performed as accurately as possible, each apparatus may introduce its own errors. These errors may adversely affect the image applied to the substrate or the position of the image on the substrate. In the event a lithographic apparatus is calibrated between two sets of substrates (commonly referred to as lots), the error may also differ for the two sets.

When two lithographic apparatuses are used simultaneously, this implies that there may be several patterning structures available containing the pattern to be applied to a given layer. The several patterning structures may also differ due to production tolerances. These differences may lead to differences in the images applied to the substrate or to differences in positions on the substrates where the images are applied.

Commonly the substrates are marked with a code that is scratched into the substrate. The substrates can be identified using these codes. The relation between the identities of the substrates and the lithographic apparatuses or the patterning structures used to project images onto the substrate is stored. The combination of the stored relations and the identity of the substrates can be used to correct for the differences, based upon knowledge of the previously used lithographic apparatus or patterning structure.

However, a special sensor is required in the lithographic apparatus to read the code in order to identify the substrate or determine the process steps applied to the substrate. This has effects on the costs of the lithographic apparatus and on the throughput since time is needed to read the code. Given the relatively high cost of a lithographic apparatus compared to the other machines used during the total production of integrated circuits, there are a limited number of lithographic apparatuses available to the system, so the throughput of the lithographic apparatus is typically the bottleneck in the production process.

In addition, placing codes on substrates has been limited because the space used to print the codes takes away from the valuable space that may be used to manufacture integrated circuits. In order to increase efficiency and reduce cost, it is desirable to manufacture additional integrated circuits on the substrate without increasing the size of the substrate. Producing integrated circuit may be made less expensive per integrated circuit or faster per integrated circuit when more integrated circuits are placed on one substrate. Therefore, the production costs can be decreased and the throughput can be increased by freeing space on the substrate for extra integrated circuits and refraining from reserving space of codes.

Known methods for increasing substrate target areas have included placing alignment marks on a back side, or second side, of the substrate, which is opposite to a front side, or first side, of the substrate. Typically, the front side includes the integrated circuit. A lithographic apparatus that includes an optical system which is capable of directing alignment radiation to the back side of the substrate is disclosed in U.S. Pat. No. 6,768,539, herein incorporated by reference in its entirety. The image of the alignment mark may be provided at a plane of the first side of the substrate. This enables a common alignment system to be used for alignment of marks on both sides of the substrate. The alignment system may be capable of performing alignment using features on the front and back of a substrate.

SUMMARY OF THE INVENTION

In a lithographic production process, markers or features may be configured to communicate various properties associated with the corresponding substrates. In one embodiment of the invention, the features may include alignment markers that provide alignment information or other information associated with the substrate. The system may be capable of identifying the substrate based on properties of the features and/or identifying the type of process that is to be applied to the substrate based on properties of the features. In another embodiment, the system may derive information from the features to automatically adjust alignment values of the system on a per substrate basis, a per lot basis or other quantity of substrates.

In a further embodiment, features may be arranged on a substrate to convey information based on spatial coordinates of a plurality of features. For example, a plurality of features may be used to generate a code using position offsets. In another embodiment of the invention, the features may be oriented relative to primary alignment markers in order to facilitate locating the features. In yet another embodiment of the invention, the features may be positioned on a first side or a second side of a substrate.

A lithographic apparatus according to one embodiment of the invention includes at least one sensor arranged to measure positions of first and second features located on a first side or a second side of a substrate, and an identification unit arranged to compare a measured relative position of the first and second features based on the measured positions with at least one of a plurality of stored relative positions of first and second features. Each of the plurality of stored relative positions of first and second features is associated with information characterising at least one substrate. The identification unit is also arranged to indicate a correspondence between the measured relative position of the first and second features and one of the plurality of stored relative positions of first and second features.

A method according to another embodiment of the invention includes measuring positions of first and second features that are located on a first side or a second side of the substrate. The method also includes comparing a measured relative position between the first and second features on the substrate, based on the measured positions, with at least one of a plurality of stored relative positions of first and second features. Each of the plurality of stored relative positions of first and second features is associated with information characterizing at least one substrate. The method also includes indicating a correspondence between the measured relative position of the first and second features on the substrate and one of the plurality of stored relative positions of first and second features.

A method of labelling a substrate according to another embodiment of the invention includes providing a first side or a second side of the substrate with a first feature; providing the corresponding first side or second side of the substrate with a second feature; and recording a correspondence between a relative position of the first and second features and information characterizing the substrate. The information may distinguish the substrate from other substrates in a group and/or indicate membership of the substrate in a group.

A method of labelling a substrate according to another embodiment of the invention includes providing a first side or a second side of the substrate with a first feature, and providing the corresponding first side or second side of the substrate with a second feature at a position relative to the first feature so that the relative positions of the first and second features provide characterising information regarding the substrate.

A lithographic apparatus according to another embodiment of the invention includes one or more sensors arranged to measure the relative positions of first and second features located on a first side or a second side of a substrate, and an identification unit arranged to compare the measured relative positions of the first and second features on the substrate with one or more stored relative positions of the first and second features. The one or more stored relative positions of the first and second features are each associated with information characterising one or more substrates. The identification unit is arranged to determine if the measured relative positions of the first and second features on the substrate correspond with one of the one or more stored relative positions of the first and second features.

A device manufacturing method according to another embodiment of the invention includes manufacturing a number of the devices on a set of substrates. Each substrate is provided with a marker that is located on a first side or a second side of the substrate to provide information regarding the position of the substrate. Each substrate is provided with a feature on a position relative to the marker such that the relative position is indicative of a setting of a process step of the substrate.

According to another embodiment, a method is provided for determining, in a lithographic apparatus having a sensor, a position of an object provided with a plurality of features having unique positions relative to one another, including providing reference information indicating, relative to a position of one of the plurality of features, the positions of the rest of the plurality of features; using the sensor to measure positions of each of a subset of the plurality of features, the measured positions including a reference position in a coordinate system; identifying a feature in the subset, based upon the measured position of the feature relative to the other measured features; and determining a position of the object, based on the identity of the identified feature, the reference information, and the measured reference position in the coordinate system, wherein the plurality of features may be located on a first side or a second side of a substrate.

A lithographic apparatus according to another embodiment includes an object table that is configured to support an object, the object being provided with a plurality of features having unique positions relative to one another; a position sensor arranged to detect each of a subset of the plurality of features; a memory unit configured to store reference information indicating, relative to a position of a reference feature of the plurality of features, the positions of the rest of the plurality of features; and a processing device, connected to the position sensor and to the memory unit, arranged to identify a feature in the subset based upon a detected position of the feature relative to the other detected features, and arranged to determine a position of the object relative to the sensor based on the reference information and a measured position of the reference feature in a coordinate system, wherein the plurality of features may be located on a first side or a second side of a substrate.

According to a further embodiment, a method is provided for determining a position of an object provided with a plurality of features, each of the plurality of features having a unique position in a two-dimensional plane relative to any other two of the plurality of features, the method includes using a sensor of a lithographic apparatus to measure positions of each of a subset of the plurality of features; identifying a feature in the subset, based upon the measured position of the feature relative to the other measured features; and determining a position of the object, based on (A) the identity of the identified feature, (B) reference information indicating, relative to a position of a reference feature of the plurality of features, the positions of the rest of the plurality of features, and (C) a position of the reference feature in a coordinate system, wherein the plurality of features may be located on a first side or a second side of a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 is a schematic cross section illustrating the substrate table incorporating two branches of an optical system for double side alignment according to an embodiment of the invention;

FIG. 3 is a plan view of a wafer showing the position and orientation of the double side alignment optics according to an embodiment of the invention;

FIG. 4 is plan view showing an alternative position and orientation of the double side alignment optics according to the invention;

DETAILED DESCRIPTION OF THE INVENTION

Figure 1:
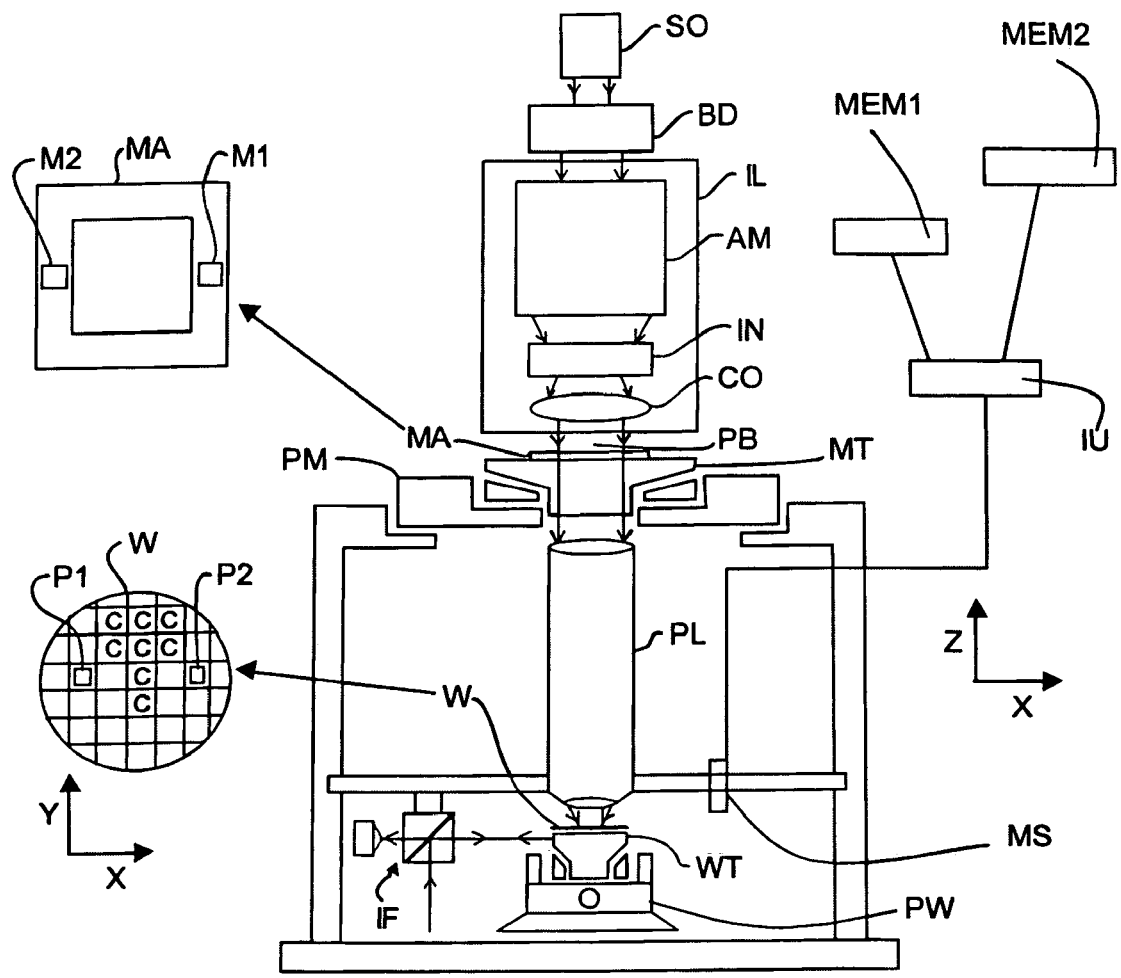
FIG. 1 depicts a lithographic apparatus according to an embodiment of the invention.

Embodiments of the present invention include methods and apparatus configured to provide substrate identification which solve one or more problems as described above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCD's), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning structure" used herein should be broadly interpreted as referring to structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning structure may be transmissive or reflective. Examples of patterning structure include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bares the weight of, the patterning structure. It holds the patterning structure in a way depending on the orientation of the patterning structure, the design of the lithographic apparatus, and other conditions, such as for example whether or not the patterning structure is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning structure is at a desired position, for example with respect to the projection system. Any use of the terms "reticle" or "mask" herein may be considered synonymous with the more general term "patterning structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art e.g. for effectively increasing the numerical aperture of projection systems.

FIG. 1 schematically depicts a lithographic apparatus according to a particular embodiment of the invention. The apparatus comprises:

an illumination system (illuminator) IL for providing a projection beam PB of radiation (e.g. UV radiation or EUV radiation).

a first support structure (e.g. a mask table) MT for supporting patterning structure (e.g. a mask) MA and connected to first positioning structure PM for accurately positioning the patterning structure with respect to item PL;

a substrate table (e.g. a wafer table) WT for holding a substrate (e.g. a resist-coated wafer) W and connected to second positioning structure PW for accurately positioning the substrate with respect to item PL; and a projection system (e.g. a refractive projection lens) PL for imaging a pattern imparted to the projection beam PB by patterning structure MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may comprise adjusting structure AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning structure PW and position sensor IF (e.g. an interferometric device), the substrate table WT can be moved accurately, e.g. so as to position different target portions C in the path of the beam PB. Similarly, the first positioning structure PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realised with the aid of a long-stroke module (coarse positioning) and a short-stroke module (fine positioning), which form part of the positioning structure PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilises programmable patterning structure, such as a programmable mirror array of a type as referred to above.

Combinations and/or variations on the above described modes of use or entirely different modes of use may also be employed.

FIG. 2 shows a wafer W on a wafer table WT. Wafer marks WM3 and WM4 are provided on a first side ("front side") of the wafer W and light can be reflected from these marks, as indicated by the arrows above WM3 and WM4, and used for alignment with marks on a mask in conjunction with an alignment system (not shown) which will be described later. Further wafer marks WM1 and WM2 are provided on the second side ("back side") of the wafer W. An optical system is built into the wafer table WT for providing optical access to the wafer marks WM1, WM2 on the back side of the wafer W. The optical system comprises a pair of arms 10A, 10B. Each arm consists of two mirrors, 12, 14 and two lenses 16, 18. The mirrors 12, 14 in each arm are inclined such that the sum of the angles that they make with the horizontal is 90 degrees. In this way, a beam of light impinging vertically on one of the mirrors will remain vertical when reflected off the other mirror.

In use, light is directed from above the wafer table WT onto mirror 12, through lenses 16 and 18, onto mirror 14 and then onto the respective wafer mark WM1, WM2. Light is reflected off portions of the wafer mark and returns along the arm of the optical system via mirror 14, lenses 18 and 16 and mirror 12. The mirrors 12, 14 and lenses 16, 18 are arranged such that an image 20A, 20B of the wafer mark WM1, WM2 is formed at the plane of the front (top) surface of the wafer W, corresponding to the vertical position of any wafer marks WM3, WM4 provided on the front side of the wafer W. The order of the lenses 16, 18 and the mirrors 12, 14 can, of course be different, as appropriate to the optical system. For example, lens 18 could be between the mirror 14 and the wafer W (see illustrations of later embodiments).

An image 20A, 20B of a wafer mark WM1, WM2 acts as a virtual wafer mark and can be used for alignment by the pre-existing alignment system (not shown) in exactly the same way as a real wafer mark provided on the front (top) side of the wafer W.

As shown in FIG. 2, the arms of the optical system 10A, 10B produce images 20A, 20B which are displaced to the side of the wafer W so that they can be viewed by an alignment system above the wafer W. Two possible orientations of the arms of the optical system 10A, 10B are shown in FIGS. 3 and 4, which are plan views of the wafer W, which lies in the XY plane. The wafer table WT is omitted from FIGS. 3 and 4 for clarity. In FIG. 3, the arms of the optical system 10A, 10B are aligned along the X axis. In FIG. 4, the arms of the optical system 10A, 10B are parallel to the Y axis. In both cases, the wafer marks WM1, WM2 lie on the X axis. The wafer marks WM1, WM2 are on the underside of the wafer W, so are reversed from the point of view of the top side of the wafer W. However, the arrangement of the mirrors of the arms of the optical system mean that the images 20A, 20B of the wafer marks WM1, WM2 are restored to be the correct way round again, not inverted, so that the images appear exactly the same as if they were on the top side of the wafer W. The optical system is also arranged so that the ratio of the size of a wafer mark WM1, WM2 to its image 20A, 20B is 1:1 i.e. there is no magnification or reduction. Consequently, the images 20A, 20B can be used exactly as if they were real wafer marks on the front side of the wafer W. A common alignment pattern or key provided on a mask can be used to perform alignment with both real and virtual wafer marks.

In the current example, wafer marks are provided on both the front and back sides of the wafer W at corresponding positions, as shown in FIG. 2. In FIGS. 3 and 4, only the wafer marks on the back side of the wafer W are shown, for clarity. According to this arrangement, when the wafer W is flipped over, by rotation about either of the X or Y axes, a wafer mark which was on the top side of the wafer W is now on the underside, but at a position such that it can be imaged by an arm of the optical system 10A, 10B.

It will be noted that, because of the mirror arrangement, displacement of the wafer in one direction parallel to an arm 10A, 10B of the optical system will displace the corresponding image 20A, 20B of a wafer mark WM1, WM2 on the under side of the wafer in the opposite direction. For example, in FIG. 3, if the wafer W were displaced to the right, the images 20A, 20B would be displaced to the left. Software controlling the alignment system takes this into account when determining the position of the wafer marks WM1, WM2 and when adjusting the relative positions of the wafer W and a mask when performing alignment. If the two arms of the optical system 10A, 10B are symmetric then the separation between the images 20A and 20B will in fact stay constant when the wafer is displaced.

At least two wafer marks are provided per side of the wafer W. A single mark can give information about the relative positioning of an image of a specific point on a mask to a specific point on the wafer. However, to ensure the correct orientational alignment and magnification, at least two marks are used.

Figure 5:
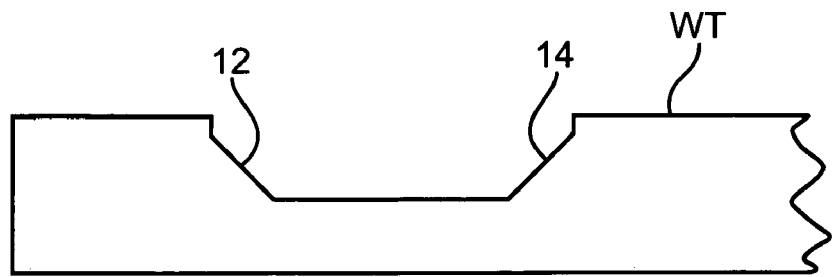
FIG. 5 is a cross section of a portion of a substrate table having integral optical components according to an embodiment of the invention.

FIG. 5 shows a portion of the wafer table WT in cross section. According to this embodiment of the invention, the optical system 10A, 10B for imaging the wafer marks on the back side of a wafer is built into the wafer table in a particular fashion. As shown in FIG. 5, the mirrors 12, 14 of an arm of the optical system are not provided as discrete components, but are integral with the wafer table WT. Appropriate faces are machined into the wafer table WT, which may then be provided with a coating to improve reflectivity, thus forming the mirrors 12, 14. The optical system is made from the same material as the wafer table, such a Zerodur™, which has a very low coefficient of thermal expansion and therefore ensures that high alignment accuracy can be maintained.

Referring back to FIG. 1, the lithographic apparatus is represented with a rectangular co-ordinate system. In the co-ordinate system, the z-direction is defined as being parallel to the optical axis of the projection system PL. The x and y co-ordinates are perpendicular to the optical axis of the projection system. In this document for a finite area (for example a target portion C), the side of the area with the lowest x co-ordinate is taken as the x co-ordinate of that area, although any other convention may be used, and different conventions may be used for different areas if desired.

Alignment may be performed by measuring the position of substrate alignment marks P1, P2 with an off-axis mark sensor MS. If the measurement by the sensor is performed off-axis, the mark does not have to be near the optical axis of the projection system PL. If the measurement is performed off-axis, it may be desirable or necessary to know or determine the relation between the position of the off-axis measurement and the optical axis of the projection system PL. Position sensor IF (e.g. a system including at least one interferometer or other optical or capacitive sensor) can be used to relate the position of the off-axis measurement and the optical axis of the projection system PL.

Mark sensor MS is connected to an identification unit IU, which is also connected to a first memory MEM1 and a second memory MEM2. The purpose of the first memory MEM1 is to store the defined positions of different areas on the substrates. Defined positions in this document mean the positions as engineered, i.e. as intended during design of a lithographic step. In practice, the positions can deviate from the defined positions. Likewise, in this document defined relative positions are the engineered relative positions. In practice, the relative positions can deviate from the defined relative positions, i.e. the intended relative positions. The purpose of the second memory MEM2 is to store the relative positions of the different areas on the substrates.

The substrate alignment marks P1, P2 are areas formed on the substrate with a fixed position. These substrate alignment marks P1,P2 provide reference positions for further process operations. By using the same reference positions in a first patterning operation as in a second patterning operation, the patterns in both operations can be positioned directly on top of each other.

Figure 6:
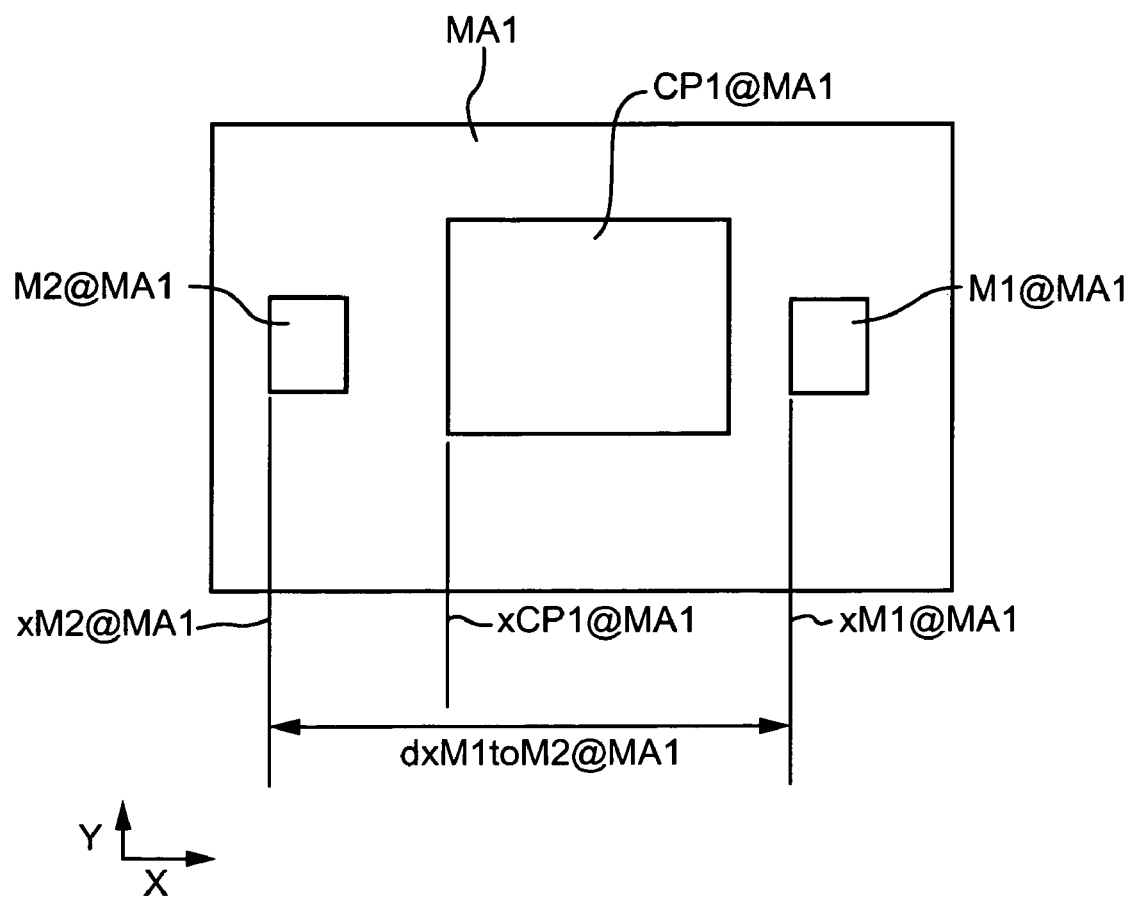
FIG. 6 depicts a patterning structure containing a first circuit pattern, a reference mark and an alignment mark, which may be used to implement an embodiment of the invention.

In an embodiment of the invention illustrated in FIG. 6, the patterning structure MA contains an alignment mark pattern M1@MA1, a first circuit pattern CP1@MA1 and a reference mark pattern M2@MA1, each covering a separate area. The term 'first circuit pattern' is intended to mean the circuit pattern of the first layer of the substrate.

In this document the names of the areas will contain an indication of the patterning structure or substrate on which they are formed. The names of the areas on patterning structure MA1 contain @MA1, the names of the areas on patterning structure MA2 contain @MA2. The names of the areas on substrate W1 contain @W1 and the names of the areas on substrate W2 contain @W2. The x co-ordinate of an alignment mark pattern M1@MA1 is xM1@MA1, the x co-ordinate of first circuit pattern CP1@MA1 is xCP1@MA1 and the x co-ordinate of reference mark pattern M2@MA1 is xM2@MA1.

The relative x co-ordinates of all three areas M1@MA1, CP1@MA1,M2@MA1 are known. The names of the relative positions contain the same indication of the patterning structure or substrate on which they are formed (for instance @MA1). Furthermore the names are built up as dxAtoB@C wherein x indicates a direction in the co-ordinate system, A and B indicate which areas are involved and C indicates on which patterning structure or substrate they are formed. Here the indication of the patterning structure or substrate is left out of the name of the areas A and B.

As an example, the relative x co-ordinate between alignment mark pattern M1@MA1 and reference mark pattern M2@MA1 is dxM1toM2@MA1.

In use, the lithographic apparatus may illuminate alignment mark pattern M1@MA1, first circuit pattern CP1@MA1 and/or reference mark pattern M2@MA1 separately, so that the images are projected onto the substrate separately. This allows the position of each pattern as projected onto the substrate to be selected independently.

Figure 7:
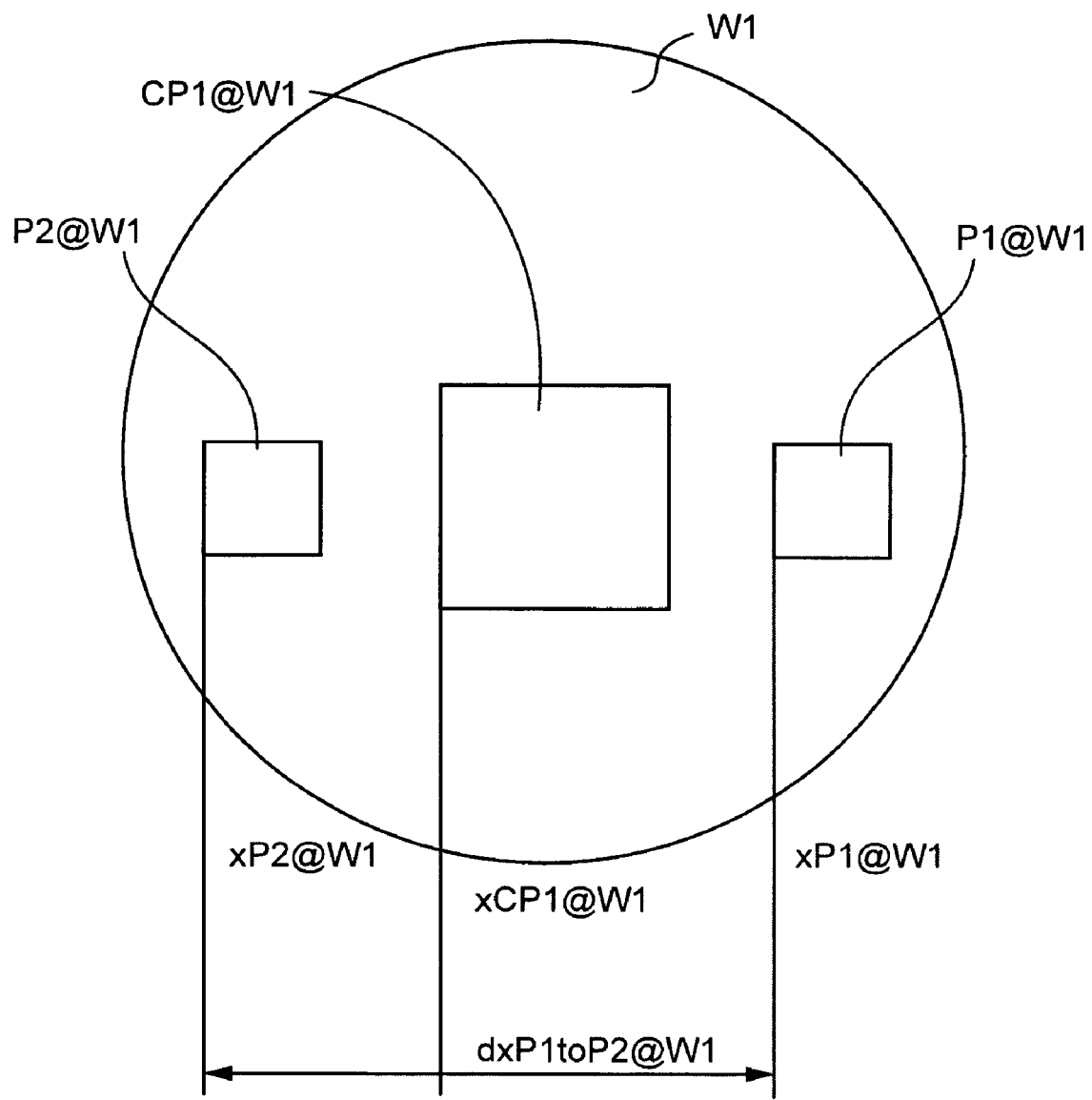
FIG. 7 shows a substrate having a substrate alignment mark, a first circuit pattern and a substrate reference mark on substrate W1 according to an embodiment of the invention.

As illustrated in FIG. 7, images of all three areas are projected onto a substrate W by illuminating the patterning structure MA1. In practice, first circuit pattern CP1@MA1 is projected onto substrate W1 repeatedly so that each target portion C is illuminated once. FIG. 7 only shows one target portion C for simplicity reasons. The images are projected onto defined positions of substrate W1 being xP1@W1, xCP1@W1 and xP2@W1 respectively (FIG. 7), which are stored in the first memory unit MEM (FIG. 1).

During the projection of the images onto substrate W1, there is a radiation-sensitive material on top of the substrate W1. The radiation-sensitive material changes locally due to the energy in the projected images.

After illumination, the substrate W1 will be processed. During processing local differences in the radiation-sensitive material per x co-ordinate are converted to presence or absence of semiconducting material at the same x co-ordinate. Some or all of the processing procedure may be performed outside the lithographic projection apparatus. Following processing, substrate W1 contains a substrate alignment mark P1@W1, a first circuit pattern CP1@W1 on substrate W1 and a substrate reference mark P2@W1.

Figure 8:
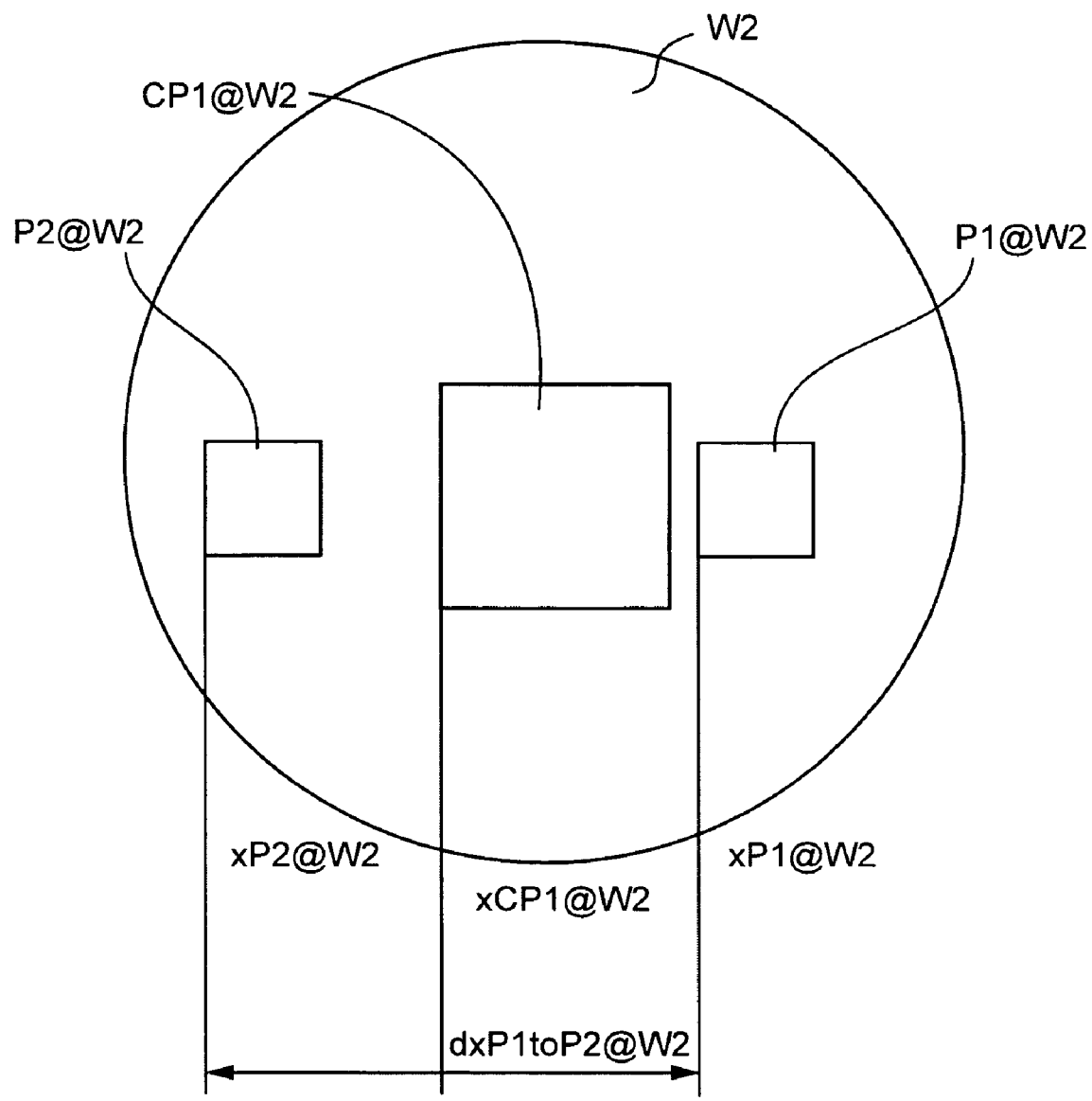
FIG. 8 shows a substrate having a substrate alignment mark, a first circuit pattern and a substrate reference mark on substrate W2 according to an embodiment of the invention.

The images of alignment mark P1@MA1, first circuit pattern CP1@MA1 and reference mark P2@MA1 are projected on a second substrate W2 using the same lithographic apparatus. For the second substrate W2 the defined x co-ordinate of the substrate alignment mark is xP1@W2 (FIG. 8), which is also stored in memory unit MEM1. This value differs from xP1@W1. The defined x co-ordinate xCP1@W2 for the first circuit pattern on substrate W2 is equal to that on substrate W1. The defined x co-ordinate xP2@W2 of reference mark P2@W2 is also equal to that on substrate W1.

Substrate W2 is also processed. The substrate W2 now contains a substrate alignment mark P1@W2, a first circuit pattern CP1 @W2 on substrate W2 and a substrate reference mark P2@W2.

For substrate W1, the distance dxP1toP2@W1 along the x-axis between the position of the substrate reference mark P2@W1 and the substrate alignment mark P1@W1 is calculated by the identification unit IU (FIG. 1) using $$dxP1toP2@W1=xP1@W1-xP2@W1$$

and stored as a first memory entry in the second memory unit MEM2 (FIG. 1) which identifies substrate W1.

For substrate W2, the distance dxP1toP2@W2 along the x-axis between the position of the substrate reference mark P2@W2 and the substrate alignment mark P1 @W2 is calculated by the identification unit IU using $$dxP1toP2@W2=xP1@W2-xP2@W2$$

and stored in a second memory entry in the second memory unit MEM2, which identifies substrate W2.

The clear difference between the distances dxP1toP2@W1 and dxP1toP2@W2 enables identification of substrate W1 and substrate W2.

Figure 9:
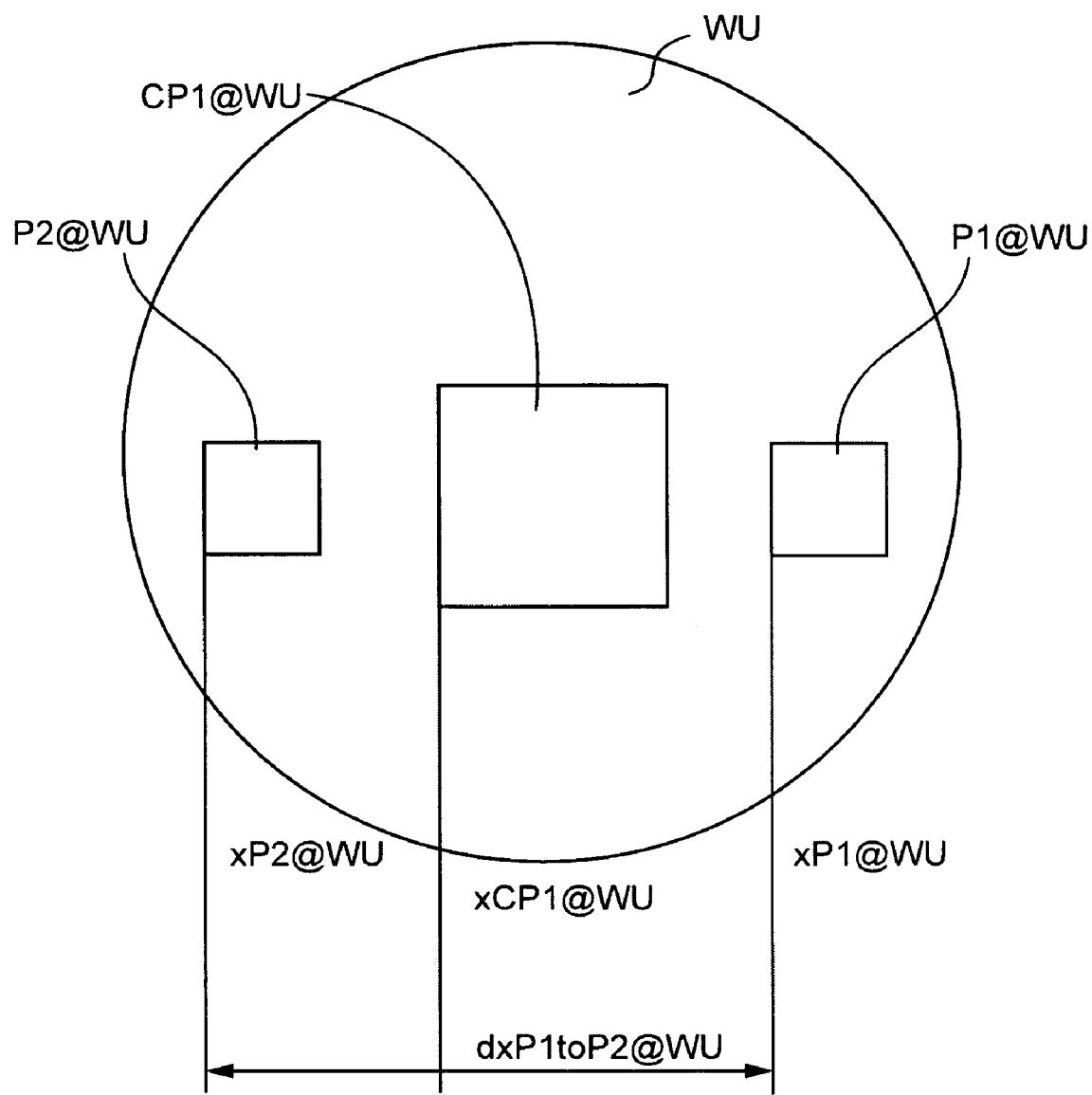
FIG. 9 shows an unidentified substrate having a substrate alignment mark, a first circuit pattern and a substrate reference mark on substrate W2 according to an embodiment of the invention.

An unidentified substrate WU (FIG. 9) is brought into the lithographic projection apparatus to form a second circuit pattern CP2@WU on top of the first circuit pattern CP1@WU on substrate WU. In order to form the second circuit pattern CP2@WU exactly on top of the first circuit pattern CP1@WU, the position of the first circuit pattern CP1@WU on substrate WU must be determined. The substrate WU on substrate table WT is positioned in the measuring field of mark sensor MS (FIG. 1). Mark sensor MS measures the position xP1@WU of substrate alignment mark P1@WU and position xP2@WU of substrate reference P2@WU.

The identification unit IU calculates the distance dxP1toP2@WU along the x-axis of the measured position xP1@WU of substrate alignment mark P1 WU and position xP2@WU of substrate alignment mark P2@WU.

The distance dxP1toP2@WU of the measured positions is compared to the entries in the second memory MEM2 by identification unit IU. The distance dxP1toP2@WU of the measured positions is equal to the first memory entry in second memory unit MEM2 containing dxP1toP2@W1. Therefore, the identification unit IU will identify the unidentified substrate as substrate W1.

If substrate W2 would have been fed into the lithographic apparatus instead of substrate W1, dxP1toP2@WU would have been the distance of the measured positions of substrate alignment marker P1@W2 and P2@W2. This distance dxP1toP2@WU would have been equal to the second memory entry of second memory unit MEM2 and the identification unit IU would have identified the unidentified substrate as substrate W2.

At least some embodiments of the invention can be used to correct for differences to the engineered status of the substrates. For example, the first circuit pattern CP1@W1 on substrate W1 is formed by projecting the image of the first circuit pattern CP1@MA1 on patterning structure MA1 onto substrate W1 via a first lithographic apparatus LA1. The first circuit pattern CP1@W2 on substrate W2 is formed by projecting the image of the first circuit pattern CP1@MA1 on patterning structure MA1 onto substrate W2 via a second lithographic apparatus LA2. Due to an error in second lithographic apparatus LA2, the relative position of the first circuit pattern CP1@W2 on substrate W2 and substrate reference mark P2@W2 is not as defined in the associated memory. The error in second lithographic apparatus LA2 is known from a previous measurement and this information is shared with the first lithographic apparatus LA1.

It may be desired to image the second circuit pattern CP2@MA2 via the first lithographic apparatus LA1 onto a substrate WU without error correction. The identity of the substrate WU is initially unknown to the first lithographic apparatus LA1. The identity of the substrate WU is determined as explained earlier. Based upon the identity of the substrate, the lithographic apparatus determines which correction must be done when imaging the second circuit pattern CP2@MA2 onto the substrate. If the substrate WU is identified as substrate W1, no correction is required. If the substrate WU is identified as substrate W2, a correction may be required. Second circuit pattern CP2@MA2 is imaged onto substrate W2 correcting for the error in lithographic apparatus LA2.

Figure 10:
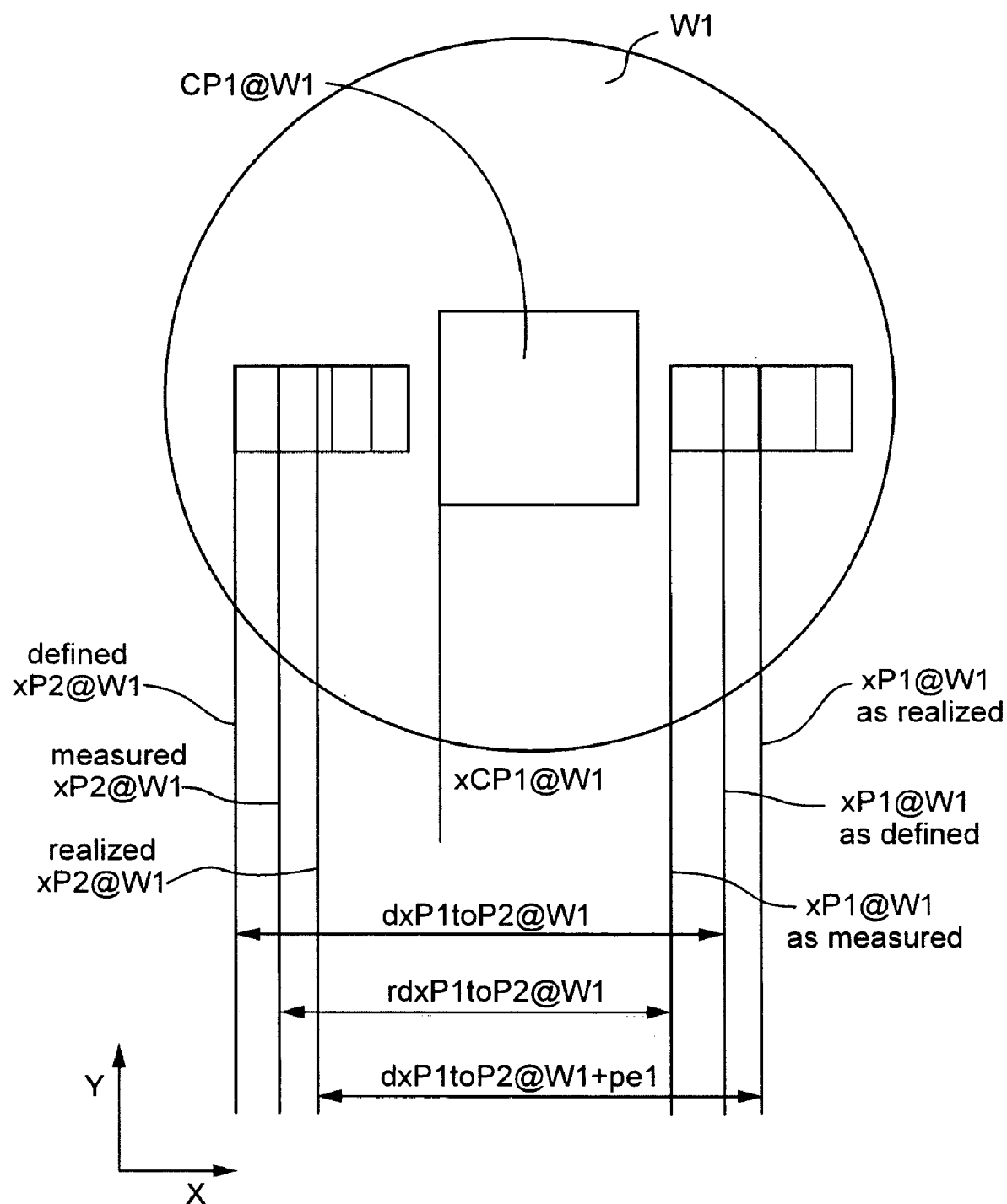
FIG. 10 shows the positions of a substrate alignment mark and a substrate reference mark as defined, as realised in practice and as measured.

At least some embodiments of the invention can be provided with a device or other structure to take into account the position and/or measurement errors associated with substrate alignment mark P1 and substrate reference mark P2. The defined position of the x co-ordinate xP2@W of the substrate reference mark is equal for both substrates W1,W2. The defined position of the x co-ordinate xP1@W1 of the substrate alignment mark on substrate W1 differs from the defined position of the x co-ordinate xP1@W2 of the substrate alignment mark on substrate W2. Apart from these defined differences, in practice errors will also occur. The relative distance dxP1toP2@Wl from substrate alignment mark P1 to substrate reference mark P2 on substrate W1 as measured can be expressed as $$rdxP1toP2@W1 = dxP1toP2@W1 + pe1 + me1,$$

where pe1 is a position error and me1 is a measurement error (see FIG. 10). An example of a position error is the error made in the distance between the circuit pattern CP1 @MA1 on patterning structure MA1 and of the reference mark P2@MA1 during production of the patterning structure MA1. As explained the lithographic apparatus may image the circuit pattern CP1@MA1, reference mark P2@MA1 and/or alignment mark P1 @MA1 separately. Where in practice the image of the circuit pattern CP1@MA1 is applied to each target portion C (FIG. 1) on substrate W1 only one image of reference mark P2@MA1 and one image of alignment mark P1@MA1 is applied to substrate W1. The imaging is done using information on the relative positions on patterning structure MA1 and the defined positions on substrate W1.

In the event the relative distance between reference mark P2@MA1 and circuit pattern CP1@MA1 on the patterning structure MA1 is not measured and accounted for during the steps of imaging the reference mark P2@MA1 and the circuit pattern CP1@MA1 onto substrate W1, the relative distance rdxCP1toP2@W1 may not be equal to dxCP1toP2W1.

Examples of measurement errors are errors made by the mark sensor and errors by the position sensor IF (FIG. 1).

For substrate W2 the corresponding distance when measured can be expressed as $$rdxP1toP2@W2 = dxP1toP2@W2 + pe2 + me2.$$

Both measured relative distances rdxP1toP2@Wl and rdxP1toP2@W2 may contain error terms. Identification unit IU compares the measured distance wD to the defined distances dxP1toP2@W1 and dxP1toP2@W2 between substrate alignment mark P1 and substrate reference mark on substrate W1 and substrate W2. It is possible that none of the defined distances dxP1toP2@W1 and dxP1toP2@W2 will be equal to the measured distance wD. Identification unit IU will determine the difference between the measured distance wD and each of the defined distances. The defined distance with the smallest difference to the measured distance wD may be selected as identifying the substrate. In the event |wD-dxP1toP2@W1|<|wD-dxP1toP2@W2| the identification unit IU will identify the substrate as substrate W1. In the event that |wD-dxP1toP2@W1|>|wD-dxP1toP2@W2| the identification unit IU will identify the substrate as substrate W2.

On the second substrate W2 the defined position of the x co-ordinate xCP1@W1 for the first circuit pattern is equal to that on substrate W1. On the second substrate W2 the defined position of the x co-ordinate xP2@W2 is also equal to that on substrate W1. On both substrates W1,W2 the position of the first circuit pattern CP1@W1, CP1@W2 can be determined by measuring the x co-ordinate xP2@W1, xP2@W2 of the substrate reference mark and accounting for the defined relative positions of the first circuit pattern CP1@W1, CP1@W2 and the substrate reference mark P2@W1, P2@W2. This distance will be referred to as dCP1 toP2@W. The relation is $$xCP1@W = xP2@W + dCP1toP2@W. \qquad (1)$$

Identification unit IU is arranged to be able to read the positions xCP1@W and xP2@W from memory unit MEM1 and to compute this distance dCP1toP2@W.

On the processed substrate W1 the distance will be referred to as rdCP1toP2@W1. The relation with the defined distance dCP1toP2@W is $$rdCP1toP2@W1 = dCP1toP2@W1 + \epsilon 1. \qquad (2)$$

The term ϵ1 is a position error similar to position error pe1.

The defined distance between first substrate pattern CP1@W1 and substrate alignment mark P1@W1 is referred to as dCP1toP1@W1. The distance as realised on substrate W1 will be referred to as rdCP1toP1@W1 and can be expressed as $$rdCP1toP1@W1 = dCP1toP1@W1 + \delta 1, \qquad (3)$$

wherein δ is a position error similar to position error ϵ1.

Likewise, on substrate W2, defined distance between first circuit pattern CP1 @W2 on substrate W2 and substrate alignment mark P1@W2 will be dCP1toP1@W2 and the realised distance will be rdCP1toP1@W2. The relation can be expressed as $$rdCP1toP1@W2 = dCP1toP1@W2 + \delta 2, \qquad (4)$$

wherein δ2 is a position error similar to position errors δ1 and δ1.

The measured x co-ordinate xP2@W1 of substrate reference mark P2@W1 can be expected to be at $$xP2@W1=xP2@W1+\xi 1. \quad (5)$$

The term $\xi 1$ is a measurement error similar to measurement error me1.

The measured x co-ordinate xP1@W1 of substrate alignment mark P1@W1 can be expected at $$xP1@W1=xP1@W1+\zeta 1. \quad (6)$$

The term $\zeta 1$ here also is measurement errors. This error does not need to be equal to the measurement error $\xi 1$, for instance because of noise.

Once both the substrate reference mark P2@W1 and the substrate alignment mark P1@W1 are formed on substrate W1 and substrate W1 is developed, both their positions can be read and can be used to determine the position of the first circuit pattern CP1@W1 on substrate W1.

The position of the first circuit pattern on substrate W1 can be estimated from $$xCP1@W1=xP2@W1+dCP1toP2@W1. \quad (7)$$

Note that here the defined distance between CP1toP2@W1 is used instead of the realised distance, since the realised position of first circuit pattern xCP1@W1 can not be measured.

The position of first circuit pattern on substrate W2 can be derived from $$xCP1@W2=xP2@W2+dCP1toP2@W2. \quad (8)$$

The position of the first circuit pattern CP1@W1 on substrate W1 can also be estimated from a measured position of substrate alignment mark P1@W1. This can be done via $$xCP1@W1=xP1@W1+dCP1toP1@W1 \quad (9)$$

For substrate W2 the position of the first circuit pattern CP1@W2 can be estimated via $$xCP1@W2=xP1@W2+dCP1toP1@W2. \quad (10)$$

After identification of the substrate, it is known if the substrate contains substrate alignment mark P1@W1 or P1@W2, i.e. if the substrate is substrate W1 or substrate W2. In the event the substrate is substrate W1, the position of the first circuit pattern can be estimated using either the measured position of the substrate reference mark (formula 7) or the measured position of the substrate alignment mark (formula 9). The estimation can also use the measured position of both the substrate reference mark and the measured position of the substrate alignment mark in order to reduce the error terms. The effect of adding the two estimations of formula 7 and 9 and dividing the result by 2 is $$xCP1@W1=(xP2@W1+dCP1toP2@W1+xP1@W1+ \\ dCP1toP1@W1)/2. \quad (11)$$

Filling in formula 5,2,6 and 3 clarifies how the errors translate into the estimated XCP1@W1

$$xCP1@W1=(xP2@W1+\xi 1+rdCP1toP2@W1-\epsilon 1+ \\ xP1@W1+\zeta 1+rdCP1toP1@W1-\delta 1)/2. \quad (12)$$

In the event that more substrate alignment marks are used, the above expression can be changed accordingly to minimise the estimation error. Using more substrate alignment marks of course also opens the possibility to uniquely identify a larger set of substrates.

In a lithographic production process, alignment markers or features may be used to code various properties associated with substrates. In one embodiment of the invention, the properties may identify the substrate and may identify the type of process to be applied to the substrate. Additionally, the properties may include alignment information associated with the substrate. In another embodiment, the system may adjust alignment values of the system for particular substrates based on information derived from the features on the substrates. A lithographic system may analyze the plurality of markers and identify the corresponding substrates.

Conventional systems may serial numbers that are written on a substrate to identify the corresponding substrate. While the serial numbers may enable identification of the substrates, their placement relative to the substrate edge is difficult to capture using a stepper capture range.

The invention enables identification of substrates based on information that is coded on a substrate using spatial coordinates for a plurality of features. The features may be oriented relative to primary alignment markers. For example, a plurality of alignment markers may generate a code using their position offset. The features may be positioned on a first side or a second side of a substrate.

The invention provides features in x- or y-directions that may be located with respect to one of the primary alignment markers. In one embodiment of the invention, the features may occupy a space 30 mm long and 0.25 mm wide or any other dimensions. The features may include codes with 50^49 digits, which the system may scan in 3/4 seconds or less time. The code may be used as a barcode to identify substrate properties, such as a type of substrate or may identify a particular substrate from a batch of substrates. The code may provide information that is used to control operation of a stepper.

The invention may include feature arrangements having a primary marker that is accurately placed relative to a known position on the substrate. Additional features may be positioned relative to the primary marker to code alignment information, such as an amount the substrate should be shifted in the x-, y-, or z-directions in order to line up with a selected element. Imaging and readout tolerances may provide limitations of code resolution for one marker arrangement. For example, if the position resolution for imaging and readout is 500 nm and the maximum offset range for the marker is 50 μm, a code resolution of $100^2$ may be attained per marker and $10^{24}$ for six markers.

The position of the substrate alignment mark P1 is drawn in FIG. 1 to be in an area similar to the target areas C. Because of the curvature of the substrate, on the edge of the substrate there are areas which are too small to fit a complete circuit. These areas are called mouse-bites. Mouse-bites can advantageously be used to contain substrate reference marks or substrate alignment marks, thereby freeing target areas C for patterning circuits.

The lines between the target areas C are commonly referred to in lithography as scribelanes. The circuits are separated from each other along these scribelanes. The scribelanes can advantageously be used to contain substrate reference marks or substrate alignment marks, thereby freeing target areas C for patterning circuits. Alternatively, the substrate reference marks or substrate alignment marks may be located on a substrate to be opposite the patterning circuits. Other configurations may be used.

In the embodiments above, the substrate alignment marks and substrate reference marks are read after processing of the substrate, prior to imaging a subsequent layer. In specific circumstances it is possible to read the markers without further processing (e.g. subsequent to exposure, or subsequent to development of an exposed resist layer). In this case, the markers may be latent. It will be clear to a person skilled in the art, that latent markers can be used in embodiments of the invention.

It will be clear to a person skilled in the art, that any feature on the substrate or of the substrate of which the position can be determined, could replace the substrate reference mark. It will be clear to a person skilled in the art, that the relative positions of the substrate reference marks and the substrate alignment marks may indicate or contain information characterising the substrate such as a date, a serial number processing information, factory information, or other information. It may also identify the number of substrates within a series with the same characteristics. Together with the serial number, for instance 7, the number of substrates within a series of for instance 9 substrates would indicate that it concerns substrate number 7 of 9 substrates. In all these cases, this characterising information regarding the substrate may be encoded in the relative positions. The characterising information regarding the substrate can be decoded with a known relation between the relative positions and the characterising information corresponding to certain relative positions. It will be understood that the characterising information regarding the substrate such as date, serial number, processing information, factory information, or other information, can be considered to identify a substrate or set of substrates.

It will be clear to a person skilled in the art, that the characterising information may be used to calibrate the lithographic apparatus. For instance, the identity of a calibration substrate may be associated with height information such as the difference in height between two positions on the substrate (x1,y1,z1),(x2,y2,z2) (not shown). Differences in height are distances along the z-axis (FIG. 1). The measured distance is compared with a previously measured distance according to the characterising information. The ratio between the previously measured distance and the measured distance can be used as a calibration ratio. Multiplying measured z-co-ordinates on the calibration substrate with the calibration ratio will result in calibrated z-co-ordinates. In other words, the lithographic apparatus is calibrated.

The calibration ratio may also be used to calibrate measurements on other substrates W. The z-co-ordinates measured on other substrate W are multiplied with the calibration ratio to give a calibrated z-co-ordinate.

It will be clear to a person skilled in the art, that within each layer on the substrate new characterising information regarding the substrate can be imaged. This can be realised by imaging a new set of an alignment marker and a reference marker onto the substrate. The new set of markers can for instance be imaged into the scribelanes of the substrate.

In the embodiments of the invention described above an off-axis mark sensor MS (FIG. 1) is used. The mark sensor MS could equally well have been on-axis. If the measurement by the sensor is performed by holding the mark so that it crosses the optical axis of the projection system PL, the sensor is called an on-axis sensor.

Specifically in a system with two substrate tables (not shown), the measurement with the mark sensor MS of substrate W2 can be performed simultaneously with illumination of substrate W1 using the projection system PL. This way the identification can be completed before the substrate is brought underneath the projection system PL.

In the embodiments above, the patterning structure MA1 may contain an alignment mark M1 and a reference mark M2. Because the marks are imaged separately onto substrate W1, it will be clear to a person skilled in the art that only alignment mark M1@MA1 is required on patterning structure MA1. The provision is that the alignment mark M1@MA1 on patterning structure MA1 is imaged onto substrate W1 at the position of substrate alignment mark P1@W1 and at the position of substrate reference mark P2@W1. Here the relative positions of substrate alignment mark P1@W1 and P2@W1 can be defined to characterise information regarding substrate W1.

An identification unit, as described herein, may include one or more arrays of logic elements, such as microcontrollers, microprocessors, or other processing units. Such an array may be configured to execute software and/or firmware instructions. Alternatively, such an array may at least in part be hard-wired (e.g. an application-specific integrated circuit). As a further alternative, such an array may be fixed but reprogrammable (e.g. a field-programmable gate array).

Figure 11:
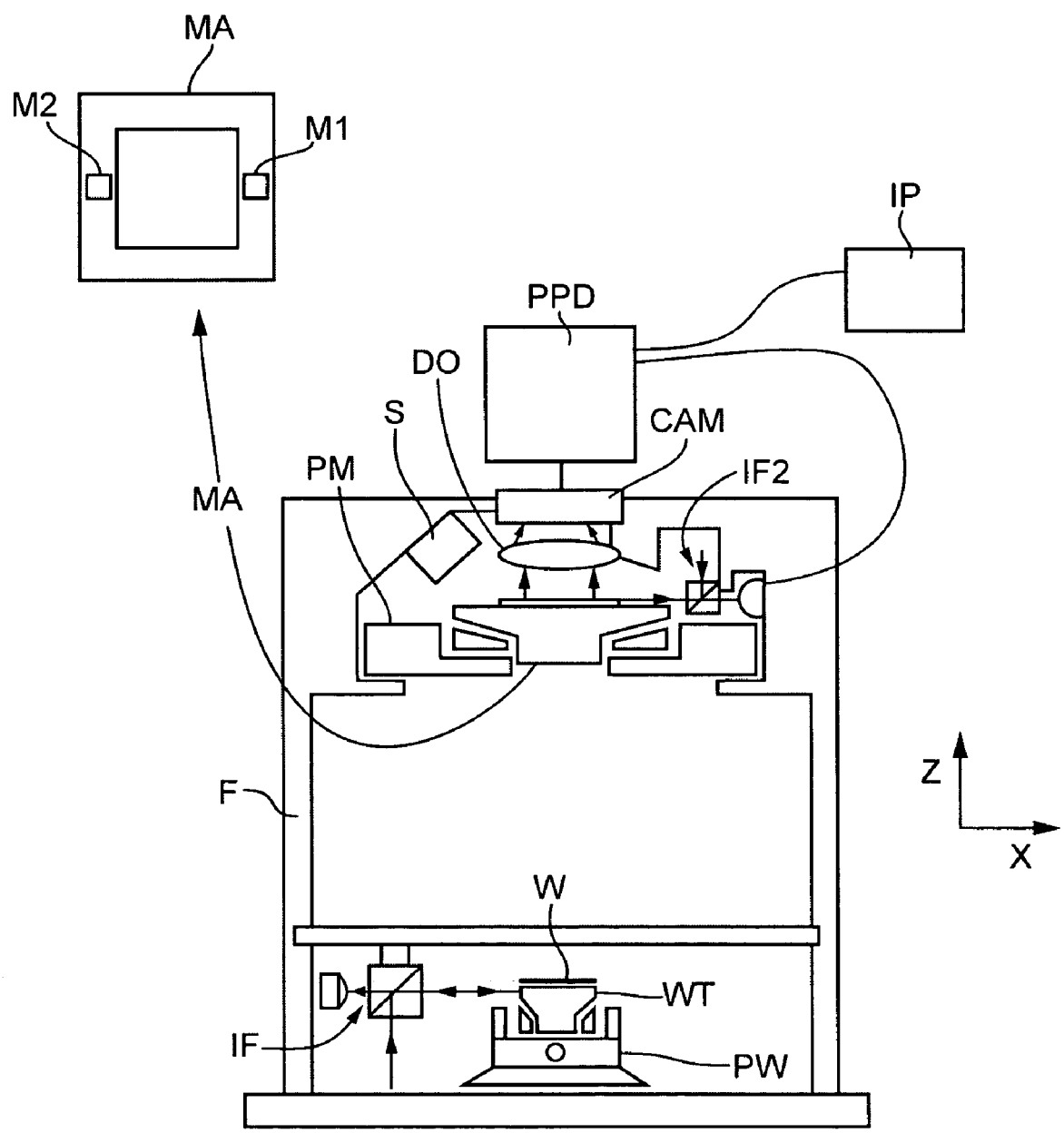
FIG. 11 depicts the lithographic apparatus of FIG. 1 in another cross section.

FIG. 11 shows a cross section of the lithographic apparatus of FIG. 1 at a different y-position compared to FIG. 1. In an embodiment of the invention, a source S of measurement radiation is fixed on a frame F (or, has a known position relative to frame F). The measurement radiation is directed to an alignment mark M1 on mask MA. Sensor detection optics DO form an image of the alignment mark M1 onto a camera CAM (having a CCD, CMOS, or other such sensor). A representation of the image formed onto the camera CAM is retrieved by a position processing device PPD. Position processing device PPD (e.g. a processor, embedded processor, or other array of logic elements executing a set of instructions in firmware and/or software) determines the position of the mask. The position processing device PPD may receives input from position sensor IF2, camera CAM and input device IP. Position sensor IF2 may be fixed to frame F (or, has a known position relative to frame F) and measures the position of the first positioner PM. In this embodiment, position sensor IF2 is an interferometer which has its base fixed to frame F and its moving part on the first positioner PM. Thus, the location of the first positioner PM is known relative to the frame when camera CAM is read. Input device IP is a keyboard, touch screen, mouse, or other device for data entry.

Figure 12:
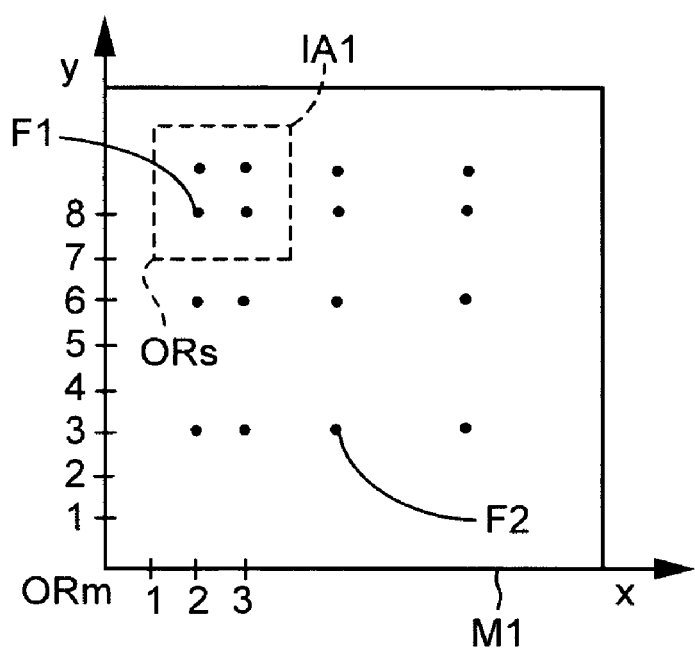
FIG. 12 depicts an alignment region containing several features.

FIG. 12 schematically shows the region of the mask which contains the alignment mark. Also shown in FIG. 12 is the xy coordinate system of FIG. 1. This region on the mask is referred to herein as the alignment region. The alignment region can be much larger than the area which is measured during alignment, the measurement area. Valid alignment measurements can be performed at multiple positions of the measurement area within the alignment region.

The alignment region M1 may include a number of features (indicated in FIG. 12 by dots, one dot indicating one feature) distributed over the alignment region M1. The features are formed by small areas with high reflectivity which reflect radiation emitted by the measurement radiation source S. The area surrounding the features is the background and has lower reflectivity.

Reference information indicating the positions of the features is stored in position processing device PPD, relative to an origin ORm of a Cartesian coordinate system of the alignment region M1. The positions of the features are designed so that the distances between the features in x- and y-directions can identify the features itself. For instance, only feature F1 has a distance to the next neighbor in the positive x-direction of 1 unit and has a distance to the next neighbor in the positive y-direction of 1 unit. Only feature F2 has a distance to the next neighbor in the positive x-direction of 5 units and has a distance to the next neighbor in the positive y-direction of 3 units. Additionally, by determining the position of any one feature, the position of any other feature may be calculated.

For a given feature, position processing device PPD determines the distances in the positive x- and y-direction to the next features, using the stored positions of the features. Position processing device PPD stores the distances in x- and y-directions for that feature in a table. This may be repeated for the other features.

Only a part of the total alignment region M1 is imaged by detection optics DO. This is the measurement area IA1. The measurement area IA1, indicated by the dashed line in FIG. 12, is visible to the camera CAM. The measurement area IA1 contains four features, one being F1, which form a subset of the features in alignment region M1.

The output of the camera CAM comprises an image of the measurement area IA1 (shown in FIG. 13) converted to electronic data. Position processing device PPD may have no prior knowledge on the identities of the four features in the measurement area IA1 indicated by dots and may label the features as U1, U2, U3 and U4. Position processing device PPD determines the positions of features U1, U2, U3 and U4 relative to an origin ORs of a Cartesian coordinate system of the camera CAM (e.g. of the camera's sensor). One unit in the Cartesian coordinate system of the camera CAM corresponds to one unit in the Cartesian coordinate system of the alignment region. The positions are used to calculate and store the distances of the features in the measurement area IA1 to the next features in the positive x- and y-direction. The distances are stored for each of the unidentified features (i.e. U1, U2, U3 and U4).

Feature U1 in image IA1 has a distance to next neighbor in the positive x-direction of 1 unit and also has a distance to the next neighbor in the positive y-direction of 1 unit.

Since only feature F1 in alignment region M1 has a distance to the next neighbor in the positive x-direction of 1 unit and a distance to the next neighbor in the positive y-direction of 1 unit as well, position processing device PPD identifies feature U1 in image IA1 as feature F1 in alignment region M1 using the calculated distances.

Using the identity of feature U1, the position of the alignment region can be determined relative to the position of the camera CCD. The positions of the features are stored in position processing device PPD relative to the origin ORm of the alignment region. In this example the coordinates of feature F1 in the alignment region are (2,8), where the first numbers between brackets indicate the x-coordinate and the second numbers indicate the y-coordinate. The coordinates of the identified feature U1 in the image IA1 are known relative to the origin ORs of the camera CAM and are (1,1). The position of the origin ORm of the alignment region with respect to the origin ORs of the camera CAM ORs is determined by:

$$ORm = \text{Coordinates}U1 - \text{Coordinates}F1,$$

where CoordinatesU1 stands for the coordinates of feature U1 and wherein CoordinatesF1 stands for the coordinates of feature F1.

Figure 13:
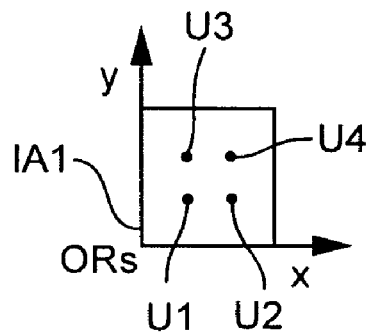
FIG. 13 depicts an image of a part of an alignment region containing several features.

In the example of FIG. 12 and FIG. 13 and using F1, the position of the origin ORm of the alignment region M1 in the coordinate system of the camera CAM is ORm=(1,1)−(2,8)= (−1,−7).

The position of the alignment region M1 on the mask MA is known. Therefore, the mask can be aligned with respect to the lithographic apparatus.

It will be appreciated by a person skilled in the art, that it is not necessary to store the positions of all features in alignment region M1 in position processing device PPD. The features for which no positions out of the reference information are stored are either not measured, or their measured positions do not lead to an identification.

Figure 14:
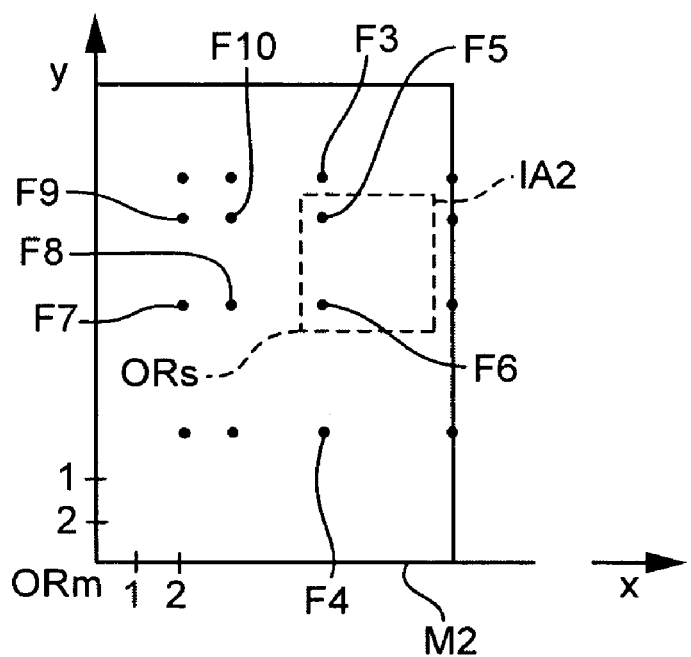
FIG. 14 depicts an alignment region containing several features.

FIG. 14 shows an alignment region M2 in an embodiment of the invention. The dots in FIG. 14 indicate individual features. Only part of the total alignment region M2 is imaged by detection optics DO. This is the measurement area IA2. The measurement area IA2 is indicated by a dashed line and contains two features F5, F6.

Figure 15:
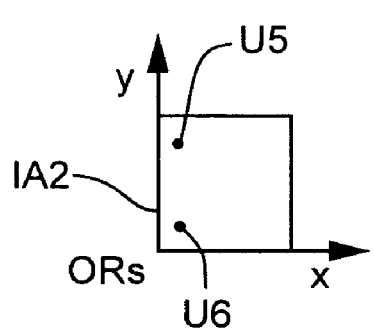
FIG. 15 depicts an image of a part of an alignment region containing several features.

The output of the camera CAM comprises an image of the measurement area IA2 (shown in FIG. 15) converted to electronic data. Position processing device PPD may have no prior knowledge of the identities of the features in measurement area IA2. Position processing device PPD determines the positions in the coordinate system of the camera CAM of the two features in the measurement area IA2 as (0.5,2.5) for U5 and (0.5,0.5) for U6. The positions are used to determine and store the distance of the feature U6 in the measurement area IA2 to feature U5, the next feature in the positive y-direction. This distance is stored.

Feature U5 does not have a neighbor in the positive x-direction. The edge of the image IA2 is at 2.5 units in the positive x-direction. Only features F3, F4, F5 and F6 in the alignment region M2 do not have neighbors in the positive x-direction within a distance of less than 2.5 units. Therefore feature U5 is identified as anyone of features F3, F4, F5 or F6.

Feature U5 does not have a neighbor in the positive y-direction, whereas the distance of feature U5 to the edge of image IA2 is 0.5 units. In the table stored in the position processing device PPD, all distances to neighbors in the positive y-direction are at least 1 unit. Therefore it cannot be identified further.

Feature U6 has a neighbor in the positive y-direction at a distance of 2 units. Since only features F7, F8 and F6 have the nearest neighbors in the positive y-direction at a distance of 2 units, feature U6 is identified as anyone of features F7, F8 and F6.

With feature U6 identified as being one of features F7, F8 or F6, feature U5 is identified as being one of features F9, F10 or F5. Since feature U5 was already identified as being one of features F3, F4, F5 or F6 the combination leads to the identification of feature U5 as feature F5.

The position of the origin of the alignment region in the coordinate system of the camera CAM can be found using the identity of feature F5 as $$ORm = \text{Coordinates}U5 - \text{Coordinates}F5$$

where the coordinates CoordinatesF5 of feature F5 are in the coordinate system of the alignment region, and the coordinates CoordinatesU5 of feature U5 are in the coordinate system of the camera CAM. This then allows alignment of the mask with respect to the lithographic apparatus.

It will be appreciated by a person skilled in the art that it may be desirable to design the alignment region such that the measurement area will contain a sufficient number of features to uniquely identify at least one feature in each possible image. For instance the features can be placed in the alignment region randomly. It can be assumed that a sufficient number of features is present in each possible image, by choosing a high density of features.

There may be a solitary feature in the alignment region, that is remote from all other features in the alignment region. If the measurement area is placed over such a solitary feature and none of the other features is present in the measurement area, the solitary feature may still be identified. Identification is performed by checking if there is no other feature in the reference information stored in position processing device PPD, that can be in the measured position relative to the camera CAM without other features visible to the camera CAM.

Figure 16:
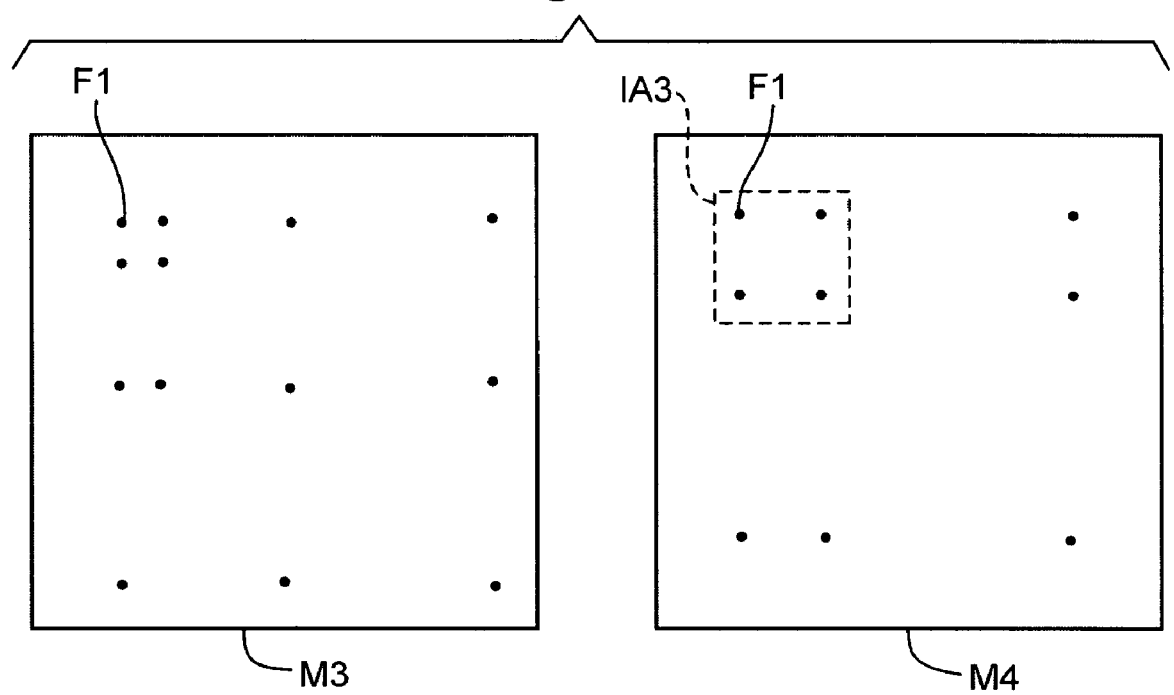
FIG. 16 depicts two alignment regions each on a different object.
Figure 17:
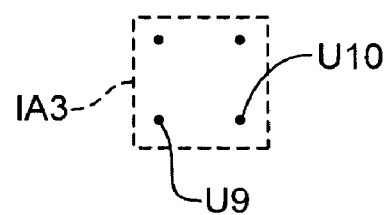
FIG. 17 depicts the image of a part of an alignment region containing several features.

In an embodiment of the invention, measured distances between features on a mask can be used to identify the alignment region or even the mask. Mask MA3 includes an alignment region M3 (FIG. 16) and mask MA4 comprises an alignment region M4 (FIG. 16). Alignment region M4 has the same size as alignment region M3. Both alignment regions M3,M4 contain a basic feature F1 (indicated in FIG. 16 by a dot) at coordinates (2,10) and contain the same pattern of features (indicated in FIG. 16 by dots). However all distances to the basic feature are multiplied by a factor 2 in alignment region M4 relative to the distances in alignment region M3. Some features which are present in the alignment region M3 do not have a counterpart in alignment region M4 because their distance to the basic feature F 1 is so large that they fall outside alignment region M4. The distances in each of the axial directions in alignment region M3 are chosen to be odd numbers of units (such as 1,3, . . . ). This means that the distances in each of the axial directions in alignment region M4 are even numbers of units (such as 2 and 6). Measuring the distance between 2 features with the same x-coordinate will now identify the features and the alignment region M3 on mask MA3 or alignment region M4 on mask MA4 as well. Part of the alignment region M4 is imaged by detection optics DO (FIG. 1). FIG. 17 shows the image IA3 visible to camera CAM.

FIG. 17 shows features U9 and U10 indicated by dots in image IA3 in FIG. 16. The distance between features U9 and U10 is (2,0). Therefore, the alignment region from which the image is taken is identified as M4. Since alignment region M4 is present on mask MA4 and not on mask MA3, the mask is identified as mask MA4.

It will be appreciated that because the alignment region, or even the mask on which the mark is present, can be identified, the alignment region could be described as information range (in the sense that it provides identity information).

It will be appreciated that there are a number of alternatives to features having a relatively high reflectivity and to area between the features having a lower reflectivity:

1. The features may be formed by spots with low reflectivity for specific radiation. The area outside the spots would have higher reflectivity for that radiation.

2. The features may be formed by spots with a different transmission than the background for specific radiation. The mask would then be placed between a sensor (in case the sensor is a position sensitive device such as a CCD-camera) or set of sensors (in case the sensors are not position sensitive devices, e.g. the sensors are photocells) and the radiation source.

3. The features may be formed by spots which scatter specific incoming radiation in a direction different from the direction into which the background scatters the incoming radiation 4. The features may be formed by spots which diffract specific incoming radiation in a direction different from the direction into which the background diffracts the specific incoming radiation.

5. The features may be areas which are elevated above the rest of the alignment region. By radiating light parallel to the measurement surface, the presence of such a feature will block the radiation. A sensor opposite to the radiation source will now be able to detect the presence of a feature.

Other types of features can be used for the invention, as will be appreciated by the person skilled in the art.

It will be appreciated that any device capable of determining the position information of features in the alignment region can be used. The features can be circuit features such as pick and place components, vias or conducting areas.

It is not necessary that the sensor include one measurement device. Any set of suitable detectors with known relative positions, can be used as a sensor to determine the position of features in the alignment region. Each measurement device detects the presence or absence of a feature in its measurement area. The positions of detected features are indicated by the identity of the measurement devices which detected the features. Examples of such devices are air gauges (capable of determining local heights), capacitance sensors (capable of determining local capacitance) and photodiodes. It will be appreciated that different detection principles correspond to the different measurement devices.

The detection optics DO may not be perfect and may cause aberrations in imaging the measurement area onto the camera CAM. For instance, the aberrations may be smallest in the center of the image. In such case, the accuracy of the measured position may be optimized by using only the positions of features in the center of the image. After identifying a first feature, a second feature close to the center may be selected and the measured position of that second feature may be used for the position determination of the alignment region.

When the sensor is first used (and/or periodically thereafter), it may be desirable or necessary to calibrate it. The sensor is calibrated using the measured positions and the positions stored in processing device PPD (FIG. 11). Having identified features F5 and F6 (FIG. 14), the measured distance can be compared with the distance determined from the positions stored in processing device PPD. The comparison is obtained by determining a ratio between the measured distance and the distance determined by the positions stored in processing device PPD. The ratio links 1 unit distance in the coordinate system of the sensor to 1 unit distance in the coordinate system of the mask MA. The sensor is calibrated by dividing the measured distances to the origin of the sensor by the determined ratio.

It will be understood by a person skilled in the art that other parameters which influence measurement by the sensor (such as rotation, field distortion and aberrations) can also be calibrated. For this calibration it may be desired to use the least squares criterion or any other suitable criterion to identify measured features and at the same time determine a parameter of the transformation going from the coordinate system of the mask MA to the coordinate system of the sensor. The alignment region of the marker as measured by the sensor may in some cases be rotated or expanded. For instance it can have any rotational angle around any axis, in addition to having an unknown position at the moment of measuring the positions of features in the measurement area with a sensor. Further possible transformations are symmetric rotation, asymmetric rotation, symmetric magnification, asymmetric magnification or higher order parameters such as position dependency of $x^2$ or xy.

This problem is solved in an embodiment of the invention by using an inverse transformation model with a parameter to be determined. The inverse transformation is applied to the positions of the measured features, resulting in transformed locations as a function of the parameter. By applying the least squares criterion to the differences between positions of features in the reference information, and transformed positions of the measured features, one can find the parameter. In the most simple form of the model, the inverse transformation model is a translation. The outcome of the model is the position. In another form of the model, the rotation angle around the x-axis is a parameter. This is determined simultaneously with the position.

It will be understood by a person skilled in the art that a transformation model may equally well be applied to features in the reference table instead of to the measurements of the features. However, since there may be more features in the reference information than in the subset of features that is measured, this may cause more computational effort than applying the inverse transformation model to the positions of the measured features. It will also be understood by a person skilled in the art that both the transformation model and the inverse transformation model may be applied to find several parameters simultaneously.

Embodiments of the invention may be advantageously used when the detection optics DO, shown schematically in FIG. 11, are telecentric on the side facing the mask. Telecentricity is useful because it ensures that the distance between the features in the image does not depend on the distance between the mask MA and the detection optics DO. Determining a position of the mask in x and y coordinates therefore is independent of the z-coordinate of the mask.

A further benefit of using telecentric detection optics is that the size of the features U5,U6 (FIG. 15) as measured, can be used to determine the distance of the mask MA from the detection optics DO. The distance of the camera CAM to the detection optics DO is fixed at a known distance to the detection optics DO, defining an image plane. A sharp image IA2 is formed when the alignment region on mask MA lies in an object plane which is conjugate to the image plane of the detection optics. If the alignment region M2 is not in the related, conjugate object plane, the features in the image IA2 may be blurred, and therefore appear larger than when the alignment region M2 is in the conjugate object plane. The size of the features U5,U6 is measured and used to indicate the distance between the alignment region M2 and the detection optics. With the known fixed distance of the camera CAM to the detection optics DO, the size of the features U5,U6 indicates the distance to the alignment region and the camera CAM.

A further advantage can be gained by using double telecentric detection optics. By using double telecentric detection optics, the distance between the features in the image does not depend on the distance of the camera CAM to the detection optics. Therefore an accurate determination of the distance between the camera CAM to the detection optics is not required.

When the mask contains two features, the position and orientation of the mask can be determined, unless the mask has been rotated by 180 degrees around a point midway between both features. When this occurs, the features swap position, and the measurements may mistake one feature for the other. Depending on the exact identification method, the swap in the identification might also take place for a rotation of 90 degrees.

Because of the handling of masks in a lithographic production environment the orientation will be known within much better accuracy than 90 degrees, and the problem is avoided. In the event an unknown rotation may have occurred, the mask may need to contain at least three features A,B,C at unique positions. Unique positions means that the distance between A and B differs from the distance between B and C and from the distance between A and C. The measurement of the position and distance between any two features forming a subset of features can be compared to the reference information stored in position processing device PPD. One of the three reference distances will give the closest match to the measured distance. In the event the positions of the features A and B have been determined, then to determine the orientation, the feature C, which can be considered to form a further subset of features, is also measured. The further subset of features could contain additional features, which may also be used to measure the rotation.

Independent measurements may be used to improve the accuracy of a method according to an embodiment of the invention. For instance the position of the mask may be determined using a first and a second (e.g. CCD, CMOS) camera, each measuring a respective one of two alignment regions with known relative positions. The relative positions of the first and the second cameras is known. The measured position for each of the two alignment regions indicates the position of the mask. The measured positions of the alignment regions are compared with their expected positions. This measures the rotation of the mask relative to the first and second cameras. To reduce the measurement noise, the positions determined with the first and the second cameras may be averaged. Alternatively the measurements may be repeated. Where this is done, the measurements for which the position information of the first camera matches best with the position information of the second camera, is selected as being the correct measurement. In addition, several measurements with one camera CAM of one alignment region can be averaged.

The position of the mask, determined using a method according to an embodiment of the invention, may be used to control the relative positions of the mask and the substrate such that a projection beam of radiation patterned by the mask will be exactly (e.g. to a high degree of accuracy, such as nanometer) on top of a target area on the substrate. Alternatively, the position of the mask may be controlled, with the substrate maintained in a fixed position. Alternatively, a control unit may control the position of the substrate based upon the position of the mask, with the mask maintained in the determined position. A control unit may be provided to control the relative position of the mask and the substrate.

In an advantageous use of an embodiment of the invention, the rotation of the mask relative to the sensor is determined and then adjusted to a desired angle. The desired angle is such that the image of the mask formed by the projection system PL has the same rotation as the target area on the substrate. Alternatively the rotation of the substrate may be adjusted.

It will be appreciated by the person skilled in the art, that the reference information may be provided in different ways. The reference information can be stored in a separate memory unit (e.g. semiconductor memory or one or more disk drives) connected to the position processing device PPD.

For the purpose of explaining principles of the invention, examples are given of an alignment region on a mask. It will be appreciated that embodiments of the invention may be practiced on substrates as well, or on an object provided with an alignment region having suitable features, the object being supported by an object table, for example a substrate table or mask table. Alternatively, the object table may be provided with an alignment region having suitable features.

According to one embodiment, a method of determining a position of an object provided with a plurality of features having unique relative positions, in a lithographic apparatus having a sensor, includes providing reference information relating the positions of the features wherein one position is an absolute position; characterized by measuring the position of a subset of the features using the sensor wherein at least one position is an absolute position in a coordinate system; and identifying one or more of the measured features based upon the unique relative position of the one or more features with respect to the other features; determining the position of the object using the identity of the one or more identified features, the reference information and one or more of the measured absolute positions in the coordinate system.

A lithographic apparatus according to a further embodiment includes an object table for supporting an object, the object being provided with a plurality of features having unique relative positions; a position sensor arranged to detect a subset of the features on the object; characterized by; a memory unit to store reference information relating the positions of the plurality of features, wherein one position is an absolute position in a coordinate system; a processing device connected to the position sensor and to the memory unit, arranged to identify one or more features out of the measured subset of features, based upon the unique relative position of the one or more features with respect to the other features and arranged to determine the position of the object relative to the sensor using the reference information and the measured absolute position in the coordinate system.

While specific embodiments of the invention have been described above, it will be appreciated that the invention may be practised otherwise than as described. The description is not intended to limit the invention. For example, embodiments of the invention also include computer programs including one or more sets (e.g. sequences) of machine-executable instructions describing one or more methods as disclosed herein, and data storage media (e.g. semiconductor memory (volatile and/or non-volatile), magnetic and/or optical disk media, etc.) containing such instructions. The scope of the invention is to be determined solely by the appended claims.

What is claimed is:

1. A lithographic apparatus comprising:
   a sensor arranged to measure positions of first and second features on a substrate;
   an identification unit, operatively connected with at least one memory and arranged to compare a relative position of the first and second features, said relative position being based on the measured positions, with at least one of a plurality of relative positions of corresponding first and second features, stored in said memory, each of the plurality of stored relative positions of first and second features being associated with information characterising at least one substrate to distinguish said at least one substrate from other substrates that have different relative positions of the corresponding first and second features,
   wherein the identification unit is arranged to indicate a correspondence between the relative position of the first and second features and one of the plurality of stored relative positions of first and second features.

2. The lithographic apparatus according to claim 1, wherein the information characterising at least one substrate indicates at least one of: a substrate identity, height information of a calibration substrate, a quantity of substrates in a set of substrates to which the substrate belongs, a date of an earlier process operation undergone by the substrate, a time of an earlier process operation undergone by the substrate, an apparatus used in an earlier operation of the lithographic process, and a patterning structure used in an earlier operation of the lithographic process.

3. The lithographic apparatus according to claim 2, wherein the identification unit is arranged to indicate a correspondence between the relative position of the first and second features and a stored relative position of first and second features, which is closest in value to the relative position.

4. The lithographic apparatus of claim 1, wherein the relative position of the first and second features includes a first distance in a first direction and a second distance in a second direction different from the first direction, and
   wherein the identification unit is arranged to compare the first distance with at least one stored distance in the first direction, the at least one stored distance in the first direction being indicative of information about a corresponding substrate, and
   wherein the identification unit is arranged to compare the second distance with at least one stored distance in the second direction, the at least one stored distance in the second direction being indicative of information about the corresponding substrate.

5. The lithographic apparatus of claim 1, wherein the apparatus includes a positioning structure arranged to position the substrate based on a position of the first feature as measured by the at least one sensor.

6. The lithographic apparatus of claim 1, wherein the apparatus includes a positioning structure configured to determine a position of the substrate based on the one of the plurality of stored relative positions of first and second features.

7. The lithographic apparatus of claim 1, wherein the apparatus includes a calibration structure configured to calibrate the apparatus based on the information characterising at least one substrate associated with the one of the plurality of stored relative positions of the first and second features.

8. The lithographic apparatus of claim 1, wherein the identification unit includes an array of logic elements and a memory storing instructions executable by the array of logic elements.

9. The lithographic apparatus of claim 1, wherein the substrate includes a plurality of features having unique positions relative to one another and wherein the sensor is configured to measure positions of the plurality of features relative to a reference position, the apparatus further comprising:
   a memory unit that is configured to store reference information indicating, relative to the position of the reference position, the location of the plurality of the features; and
   a processor device, coupled to the sensor and to the memory unit, that is configured to identify the first and second features from among the plurality of features.

10. The lithographic apparatus of claim 1, wherein the substrate includes a target portion positioned on a first side of the substrate and a feature portion positioned on a second side of the substrate, the second side being located opposite to the first side, the second side having a plurality of features located thereon, the lithographic apparatus further comprising:
    an optical system that is configured to transmit an image of the plurality of features from the second side of the substrate onto a plane that is located outside of a perimeter of the substrate.

11. The lithographic apparatus of claim 10, wherein the optical system places the image of the plurality of features from the second side within a capture range of the sensor.

12. A method of obtaining information regarding a substrate, said method comprising:
    measuring positions of first and second features on a substrate and storing the measured positions in at least one memory;
    comparing a relative position between the first and second features on the substrate, said relative position being based on the measured positions, with at least one of a plurality of relative positions of corresponding first and second features, stored in said memory, each of the plurality of stored relative positions of the corresponding first and second features being associated with information characterizing at least one substrate to distinguish said at least one substrate from other substrates that have different relative positions of the first and second features; and indicating a correspondence between the relative position of the first and second features and one of the plurality of stored relative positions of the corresponding first and second features.

13. The method according to claim 12, wherein indicating the correspondence includes indicating the correspondence between the relative position of the first and second features and a stored relative position of first and second features, which is closest in value to the relative position.

14. The method according to claim 12, wherein the substrate includes a plurality of features having unique positions relative to one another, the method further comprising:

measuring positions of the plurality of features, based on a reference position; and identifying the first and second features among the plurality of features.

15. The method according to claim 12, further comprising:

projecting an optical beam onto a feature portion of a second side of the substrate that includes a plurality of features, the second side of the substrate being located opposite to a first side of the substrate having a target portion; and creating an image of the plurality of features from the second side of the substrate on a plane that is located outside a perimeter of the substrate.

16. The method according to claim 15, further comprising placing the image of the plurality of features within a capture range to enable measuring of the positions of the first and second features on the substrate.

17. A device manufacturing method comprising:

manufacturing a plurality of devices on a set of substrates, each substrate having a marker and a feature at a unique position relative to the marker;

for at least one of the set of substrates, measuring a position of at least one of the feature and the marker relative to the other of the feature and the marker, and storing the measured position in at least one memory;

comparing the measured relative position to at least one of a plurality of entries in a data set stored in the memory, each entry corresponding to a relative position between the marker and feature of one of the set of substrates; and identifying the substrate by selecting an entry corresponding to the measured relative position to distinguish the substrate from other substrates that have different relative positions of the marker and the feature, wherein said manufacturing includes modifying a process operation based on the identity of the substrate.

18. A method of labeling a substrate, said method comprising:

providing the substrate with a first feature;

providing the substrate with a second feature; and recording and storing in at least one memory a correspondence between a relative position of the first and second features and information characterizing the substrate to distinguish the substrate from other substrates that have different relative positions of corresponding first and second features.

19. The method according to claim 18, wherein the substrate is part of a set of substrates; and wherein the information characterizing the substrate is common to each substrate of the set of substrates.

20. The method according to claim 18, wherein the substrate is part of a set of substrates; and wherein the information characterizing the substrate distinguishes the substrate from others in the set of substrates.

21. The method according to claim 18, wherein the substrate is part of a set of substrates; and wherein the information indicates at least one of: the substrate identity, height information of a calibration substrate, a quantity of substrates in a set of substrates to which the substrate belongs, the date of an earlier process operation undergone by the substrate, the time of an earlier process operation undergone by the substrate, an apparatus used in an earlier operation of the lithographic process, and a patterning structure used in an earlier operation of the lithographic process.

22. A device manufacturing method comprising:

manufacturing a plurality of devices on a set of substrates, each substrate having a marker that indicates a position of the substrate and a feature at a position relative to the marker, and storing the positions in at least one memory; and for one of the set of substrates, determining a relative position of the marker and feature to distinguish said one of the set of substrates from other substrates that have different relative positions of the marker and the feature, wherein said manufacturing includes selecting an aspect of a process operation on the substrate based on the determined relative position.

23. A lithographic substrate comprising:

a first feature; and a second feature at a relative position to the first feature, wherein the relative position indicates information that has been encoded onto the lithographic substrate, and stored in at least one memory, to distinguish the lithographic substrate from other substrates that have different relative positions of corresponding first and second features.

24. The lithographic substrate according to claim 23, wherein the information indicates at least one of: a substrate identity, height information of a calibration substrate, a quantity of substrates in a set of substrates to which the substrate belongs, a date of an earlier process operation undergone by the substrate, a time of an earlier process operation undergone by the substrate, an apparatus used in an earlier operation of the lithographic process, and a patterning structure used in an earlier operation of the lithographic process.

25. The lithographic substrate according to claim 23, wherein the first feature is created on the substrate at a first time, and wherein the second feature is created on the substrate at a second time separate from the first time.

26. The lithographic substrate according to claim 23, wherein the first feature is imaged onto the substrate by an exposure at a first time, and wherein the second feature is imaged onto the substrate by an exposure at a second time separated from the first time by a period of non-exposure.

* * * * *